US012745382B2

(12) United States Patent
Kang

(10) Patent No.: US 12,745,382 B2
(45) Date of Patent: Sep. 22, 2026

(54) INTEGRATED CIRCUIT DEVICE AND METHOD OF MANUFACTURING THE SAME

(71) Applicant: SAMSUNG ELECTRONICS CO., LTD., Suwon-si (KR)

(72) Inventor: Jongin Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 545 days.

(21) Appl. No.: 18/308,453

(22) Filed: Apr. 27, 2023

(65) Prior Publication Data

US 2024/0023306 A1 Jan. 18, 2024

(30) Foreign Application Priority Data

Jul. 14, 2022 (KR) ........................ 10-2022-0087086

(51) Int. Cl.
*H10B 12/00* (2023.01)

(52) U.S. Cl.
CPC .................................. *H10B 12/033* (2023.02)

(58) Field of Classification Search
CPC .. H10B 12/00; H10B 12/033; H10B 12/0335; H10B 12/05; H10B 12/053; H10B 12/09; H10B 12/315; H10B 12/482; H10B 12/485
See application file for complete search history.

(56) References Cited

U.S. PATENT DOCUMENTS 5,622,883 A 4/1997 Kim
7,166,507 B2 1/2007 Yun
8,012,810 B2 9/2011 Wang et al.
9,184,168 B2 11/2015 Ryu et al.
11,374,010 B2 6/2022 Tung et al.
(Continued)

FOREIGN PATENT DOCUMENTS

CN 107845633 3/2018
CN 107482007 6/2018
(Continued)

OTHER PUBLICATIONS

Notice of Allowance dated Sep. 2, 2024 in related TW Patent Application No. 112116864 (4 pages).
(Continued)

*Primary Examiner* — Brook Kebede
(74) *Attorney, Agent, or Firm* — Morgan, Lewis & Bockius LLP

(57) ABSTRACT

A method of manufacturing an integrated circuit device includes forming multiple conductive layers on an upper surface of a substrate, forming a capping structure arranged on the multiple conductive layers and extending in a first direction, forming a plurality of bit lines extending in the first direction by patterning the multiple conductive layers using the capping structure, and forming a plurality of buried layers in a space between neighboring bit lines of the plurality of bit lines. The capping structure includes a lower insulating capping layer, an insulating layer disposed on the lower insulating capping layer, and a polysilicon layer disposed on the insulating layer. The polysilicon layer includes a material having an etch selectivity with respect to the insulating layer.

20 Claims, 34 Drawing Sheets

(56) References Cited

U.S. PATENT DOCUMENTS

| | | | | |
|---|---|---|---|---|
| 2003/0124796 | A1* | 7/2003 | Jeon | H10B 12/315 438/254 |
| 2004/0110339 | A1 | 6/2004 | Clampitt | |
| 2004/0266170 | A1 | 12/2004 | Yun | |
| 2012/0168899 | A1* | 7/2012 | Kim | H01L 21/7682 438/586 |
| 2021/0057339 | A1* | 2/2021 | Lee | H10B 12/315 |
| 2021/0124258 | A1* | 4/2021 | Ahn | H10B 12/03 |
| 2022/0045182 | A1 | 2/2022 | Kim et al. | |
| 2022/0068938 | A1 | 3/2022 | Lu | |
| 2022/0139920 | A1 | 5/2022 | Lee | |
| 2022/0415793 | A1* | 12/2022 | Kim | G11C 5/063 |

FOREIGN PATENT DOCUMENTS

| | | | |
|---|---|---|---|
| CN | 111463208 | | 10/2021 |
| CN | 113594098 | | 11/2021 |
| CN | 114068555 | | 2/2022 |
| KR | 10-0168338 | | 10/1998 |
| KR | 10-2002-0046778 | | 6/2002 |
| KR | 10-2003-0057947 | A | 7/2003 |
| KR | 10-2007-0052653 | A | 5/2007 |
| KR | 10-2021-0014018 | A | 2/2021 |
| KR | 10-2021-0022979 | A | 3/2021 |
| TW | 201117325 | A | 5/2011 |

OTHER PUBLICATIONS

First Office Action issued Jan. 29, 2026 in corresponding Korean Patent Application No. 10-2022-0087086.

* cited by examiner

INTEGRATED CIRCUIT DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0087086, filed on Jul. 14, 2022, in the Korean Intellectual Property Office, the disclosure of which is incorporated by reference herein in its entirety.

TECHNICAL FIELD

The inventive concept relates to an integrated circuit, and more particularly, to an integrated circuit device and a method of manufacturing the integrated circuit device.

DISCUSSION OF THE RELATED ART

With the downscaling of integrated circuit devices, the size of an individual microcircuit pattern for implementing an integrated circuit device is further reduced. In addition, as integrated circuit devices are highly integrated, the line width of bit lines decreases, and the difficulty associated with forming a contact between the bit lines increases.

SUMMARY

A method of manufacturing an integrated circuit device includes forming multiple conductive layers on an upper surface of a substrate. A capping structure arranged on the multiple conductive layers and extending in a first direction is formed. A plurality of bit lines extending in the first direction is formed by patterning the multiple conductive layers using the capping structure. A plurality of buried layers is formed in a space between neighboring bit lines of the plurality of bit lines. The capping structure includes a lower insulating capping layer, an insulating layer disposed on the lower insulating capping layer, and a polysilicon layer disposed on the insulating layer. The polysilicon layer includes a material having an etch selectivity with respect to the insulating layer.

A method of manufacturing an integrated circuit device includes forming multiple conductive layers on an upper surface of a substrate. A capping structure arranged on the multiple conductive layers and extending in a first direction is formed. A plurality of bit lines extending in the first direction is formed by etching the multiple conductive layers using the capping structure. A spacer structure is formed on opposite sidewalls of each of the plurality of bit lines. A polysilicon layer is formed in a space between neighboring bit lines of the plurality of bit lines. The polysilicon layer covers an upper portion of each of the plurality of bit lines and an outer surface of the spacer structure.

A method of manufacturing an integrated circuit device includes forming multiple conductive layers on an upper surface of a substrate. A capping structure arranged on the multiple conductive layers and extending in a first direction is formed. A plurality of bit lines extending in the first direction is formed by etching the multiple conductive layers using the capping structure. A spacer structure is formed on opposite sidewalls of each of the plurality of bit lines. A polysilicon layer is formed in a space between neighboring bit lines of the plurality of bit lines. An insulating space is formed by etching a portion of the polysilicon layer. Each of the plurality of bit lines includes a tungsten layer. An upper surface of the polysilicon layer is at a higher level than an upper surface of the tungsten layer. The polysilicon layer including doping ions is disposed in a space between neighboring bit lines of the plurality of bit lines in a second direction that is perpendicular to the first direction. An upper end of the polysilicon layer is connected to a lower electrode of a capacitor formed on the plurality of bit lines. A lower end of the polysilicon layer is connected to the substrate.

BRIEF DESCRIPTION OF THE DRAWINGS

Embodiments of the inventive concept will be more clearly understood from the following detailed description taken in conjunction with the accompanying drawings in which:

FIGS. 3A to 18 are cross-sectional views illustrating process sequences for explaining a method of manufacturing an integrated circuit device, according to embodiments, in particular, FIGS. 3A, 4A, 5A, 6A, 7A, 8 to 10, 11A, 12A, 13A, 14, 15A, 16A, and 17 are cross-sectional views corresponding to cross-sections taken along lines A1-A1' and A2-A2' of FIG. 1, and FIGS. 3B, 4B, 5B, 6B, 7B, 11B, 12B, 13B, 15B, and 16B are cross-sectional views corresponding to cross-sections taken along line B-B' of FIG. 1;

FIG. 18 is a layout diagram illustrating an integrated circuit device according to embodiments;

DETAILED DESCRIPTION OF THE EMBODIMENTS

The inventive concept will now be described more fully with reference to the accompanying drawings, in which example embodiments of the inventive concept are shown. The inventive concept may, however, be embodied in many different forms and should not necessarily be construed as being limited to the example embodiments set forth herein. Rather, these embodiments are provided so that this disclosure will be thorough and complete, and will fully convey the concept of the inventive concept to those skilled in the art.

Figure 1:
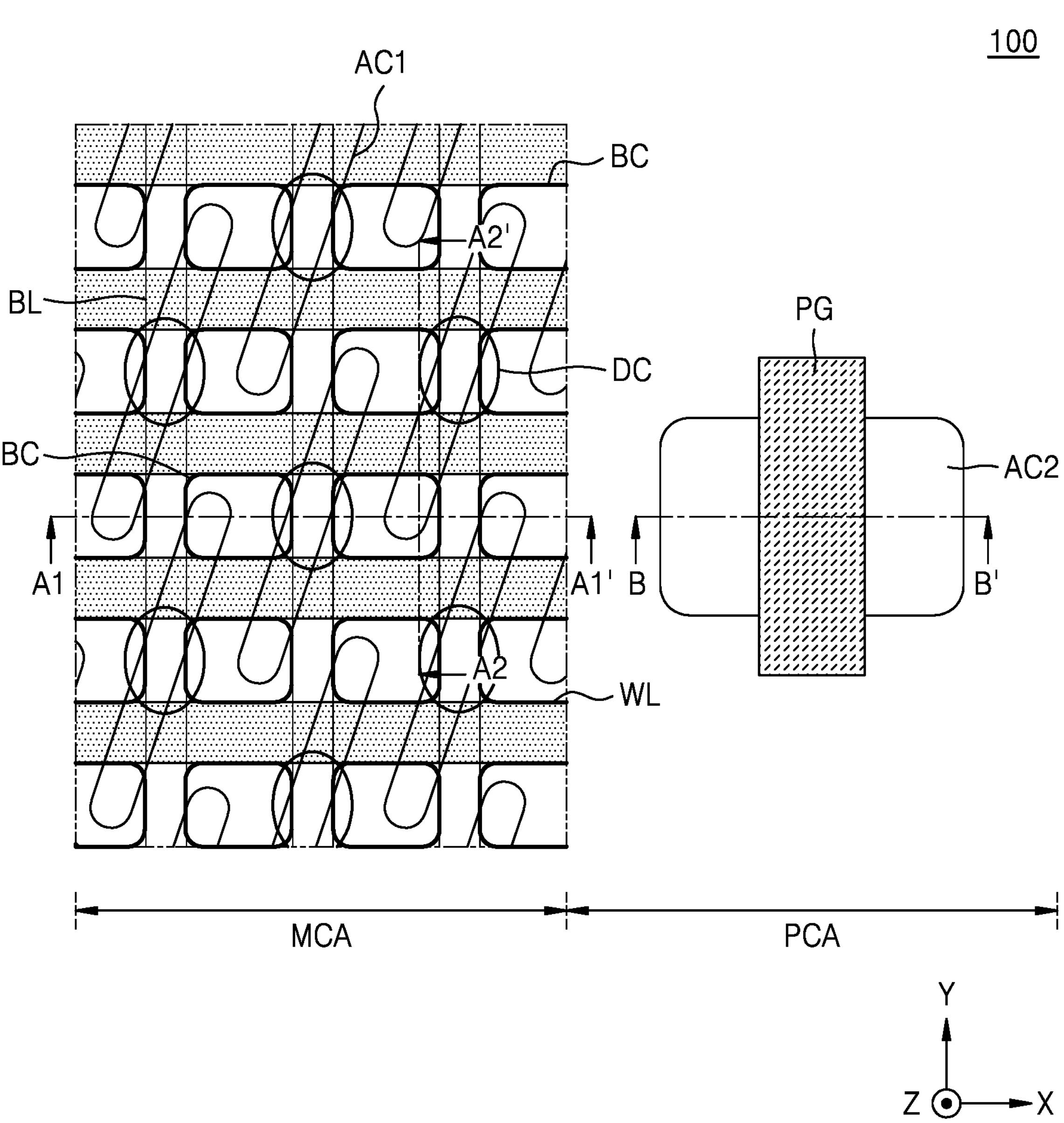
FIG. 1 is a layout diagram illustrating an integrated circuit device according to embodiments.
Figure 2A:
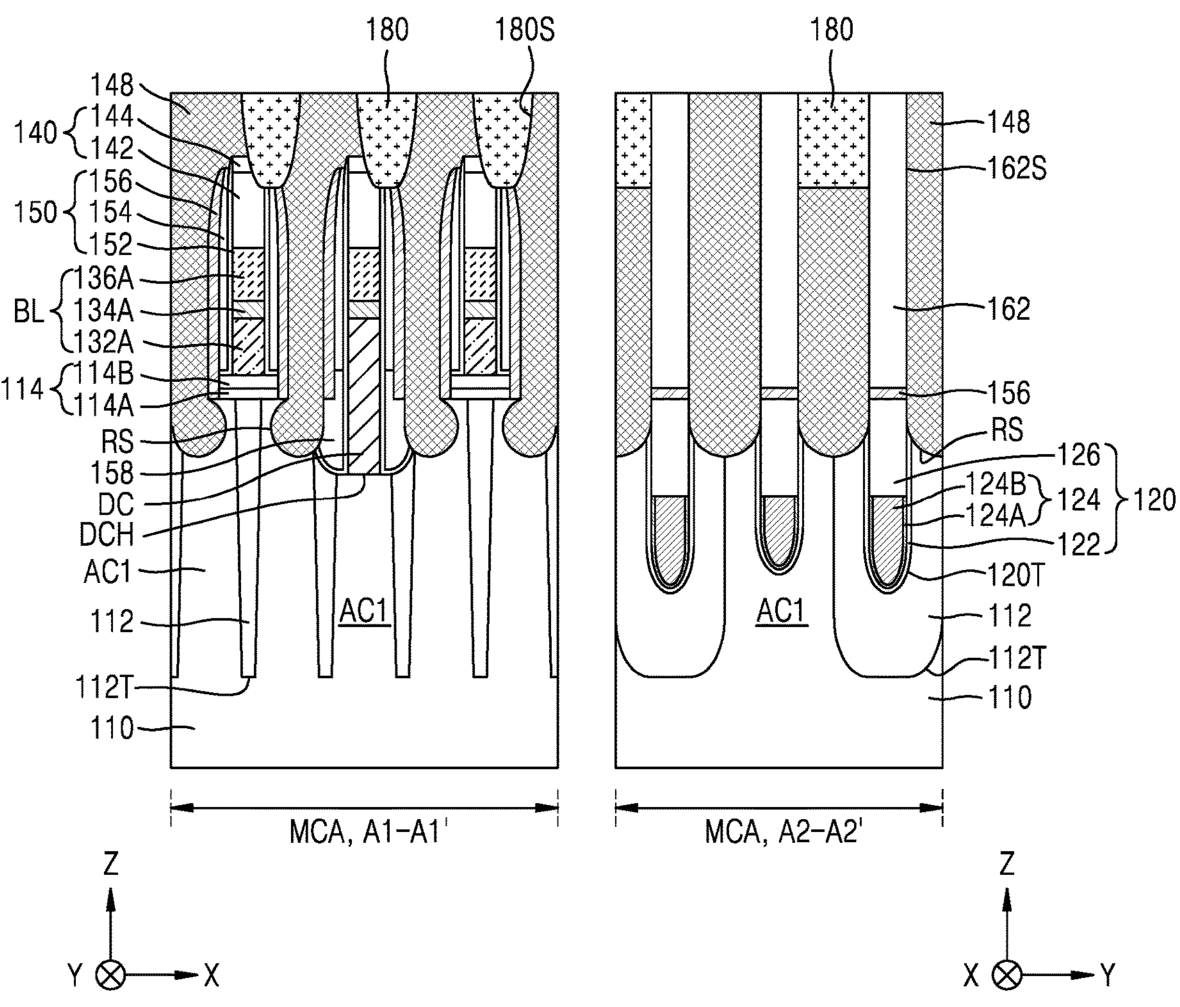
FIG. 2A includes cross-sectional views respectively taken along lines A1-A1' and A2-A2 of FIG. 1.

FIG. 1 is a layout diagram illustrating an integrated circuit device 100 according to embodiments. FIG. 2A illustrates cross-sectional views respectively taken along lines A1-A1' and A2-A2', and FIG. 2B is a cross-sectional view of the integrated circuit device 100 taken along line B-B'.

Figure 2B:
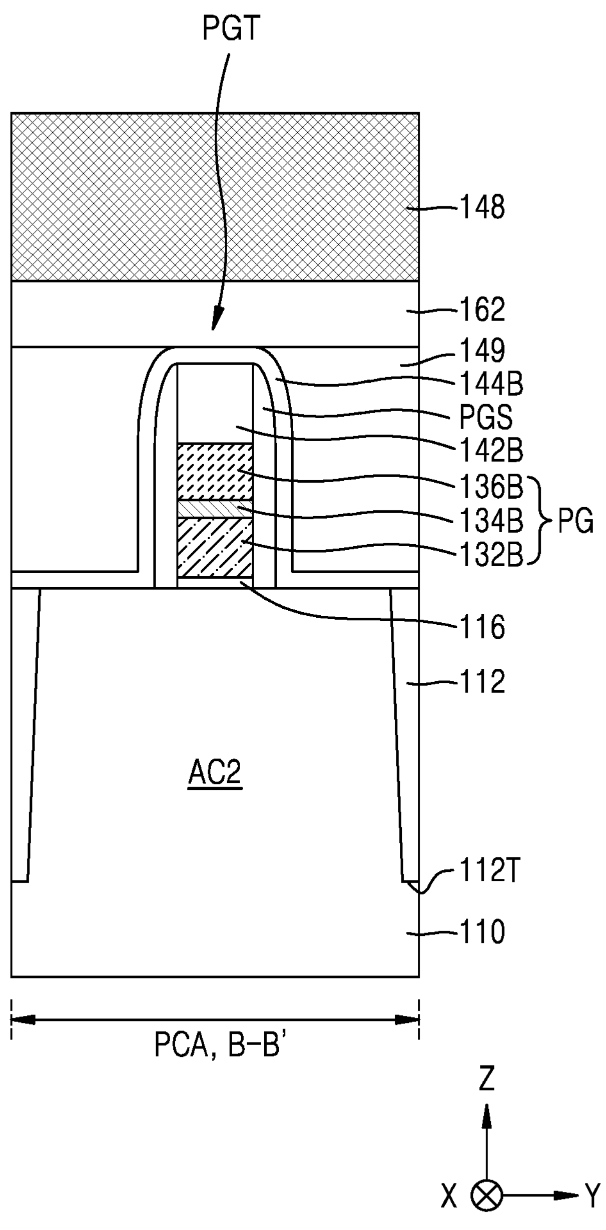
FIG. 2B is a cross-sectional view of the integrated circuit device taken along line B-B' of FIG. 1.

Referring to FIGS. 1, 2A, and 2B, the integrated circuit device 100 may include a substrate 110 including a cell array area MCA and a peripheral circuit area PCA. A device isolation trench 112T may be formed in the substrate 110, and a device isolation film 112 may be formed in the device isolation trench 112T. Through the device isolation film 112, a plurality of first active areas AC1 may be defined on the substrate 110 in the cell array area MCA, and a second active area AC2 may be defined on the substrate 110 in the peripheral circuit area PCA.

Each of the plurality of first active areas AC1 may have a long axis in a diagonal direction with respect to a first horizontal direction X and a second horizontal direction Y. A plurality of word lines WL may extend parallel to each other in the first horizontal direction X by crossing the plurality of first active areas AC1. A plurality of bit lines BL may be connected to the plurality of first active areas AC1 through direct contacts DC, respectively.

A plurality of buried contacts BC may be formed between two adjacent bit lines BL among the plurality of bit lines BL. The plurality of buried contacts BC may be arranged in a row in the first horizontal direction X and the second horizontal direction Y. The plurality of buried contacts BC may connect a lower electrode of a capacitor formed on the plurality of bit lines BL and a first active area AC1 to each other.

The substrate 110 may include silicon, for example, monocrystalline silicon, polycrystalline silicon, or amorphous silicon. In some embodiments, the substrate 110 may include Ge, SiGe, SiC, GaAs, InAs, and/or InP. In some embodiments, the substrate 110 may include an electrically conductive area, for example, a well doped with an impurity, or a structure doped with an impurity. The device isolation film 112 may include an oxide film, a nitride film, or a combination thereof.

In the cell array area MCA, a plurality word line trenches 120T extending in the first horizontal direction X may be formed in the substrate 110, and a plurality of buried peripheral circuit gate structures 120 may be respectively arranged in the plurality word line trenches 120T. Each of the plurality of buried peripheral circuit gate structures 120 may include a gate dielectric film 122, a buried gate electrode 124, and a capping insulating film 126. The buried gate electrode 124 may correspond to the plurality of word lines WL shown in FIG. 1. The gate dielectric film 122 may include a silicon oxide film, a silicon nitride film, a silicon oxynitride film, an oxide/nitride/oxide (ONO) film, or a high-k dielectric film having a higher dielectric constant than that of a silicon oxide film. As used herein, the phrase, “high-k dielectric” means having a dielectric constant, k, greater than or equal to that of silicon oxide. The buried gate electrode 124 may include a work function adjusting layer 124A conformally arranged on a lower inner wall of each of the plurality word line trenches 120T, and a buried conductive layer 124B filling the lower inner wall of each of the plurality word line trenches 120T. For example, the work function adjusting layer 124A may include a metal, a metal nitride, or a metal carbide, such as Ti, TiN, TiAlN, TiAlC, TiAlCN, TiSiCN, Ta, TaN, TaAlN, TaAlCN, TaSiCN, or the like, and the buried conductive layer 124B may include W, WN, TiN, TaN, and/or doped polysilicon. The capping insulating film 126 may include a silicon oxide film, a silicon nitride film, a silicon oxynitride film, or a combination thereof.

In the cell array area MCA, a buffer film 114 may be formed on the substrate 110. The buffer film 114 may include a first insulating film 114A and a second insulating film 114B. Each of the first insulating film 114A and the second insulating film 114B may include an oxide film, a nitride film, or a combination thereof.

A plurality of direct contacts DC may be formed in a plurality of direct contact holes DCH on the substrate 110, respectively. The plurality of direct contacts DC may be connected to the plurality of first active areas AC1, respectively. The plurality of direct contacts DC may each include doped polysilicon. For example, the plurality of direct contacts DC may each include polysilicon containing an n-type impurity, such as phosphorus (P), arsenic (As), bismuth (Bi), and antimony (Sb), at a relatively high concentration.

The plurality of bit lines BL may extend long on the substrate 110 and the plurality of direct contacts DC in the second horizontal direction Y. Each of the plurality of bit lines BL may be connected to the first active area AC1 through the direct contact DC. The plurality of bit lines BL may each include a lower conductive pattern 132A, an intermediate conductive pattern 134A, and an upper conductive pattern 136A, which are sequentially stacked on the substrate 110. The lower conductive pattern 132A may include doped polysilicon. Each of the intermediate conductive pattern 134A and the upper conductive pattern 136A may include TiN, TiSiN, W, tungsten silicide, or a combination thereof. In embodiments, the intermediate conductive pattern 134A may include TiN, TiSiN, or a combination thereof, and the upper conductive pattern 136A may include W.

The plurality of bit lines BL may be covered with a plurality of capping structures 140, respectively. Each of the plurality of capping structures 140 may include a lower capping layer 142 and an insulating layer 144. The lower capping layer 142 may include a silicon nitride film, a silicon carbonitride film, or a combination thereof. The insulating layer 144 may include a silicon nitride film. The plurality of capping structures 140 may extend in the second horizontal direction Y on the plurality of bit lines BL.

A spacer structure 150 may be arranged on opposite sidewalls of each of the plurality of bit lines BL. The spacer structure 150 may extend in the second horizontal direction Y on opposite sidewalls of each of the plurality of bit lines BL, and a portion of the spacer structure 150 may extend to the inside of the direct contact hole DCH to cover opposite sidewalls of the direct contact DC.

In embodiments, the spacer structure 150 may include a first spacer layer 152, a second spacer layer 154, and a third spacer layer 156. The first spacer layer 152 is conformally arranged on sidewalls of each of the plurality of bit lines BL, sidewalls of the capping structure 140, and an inner wall of the direct contact hole DCH. The second spacer layer 154 and the third spacer layer 156 may be sequentially arranged on the first spacer layer 152. In some embodiments, the first and third spacer layers 152 and 156 may each include silicon nitride, and the second spacer layer 154 may include silicon oxide. In some embodiments, the first and third spacer layers 152 and 156 may each include silicon nitride, and the second spacer layer 154 may include air or a low-k dielectric material. Here, the term “air” may refer to a space containing ordinary atmosphere or other gases that may be present during a manufacturing process.

A buried insulating layer 158 may at least partially surround a lower sidewall of the direct contact DC on the first spacer layer 152, and may fill a remaining space of the direct contact hole DCH. The buried insulating layer 158 may include silicon nitride, silicon oxynitride, silicon oxide, or a combination thereof.

The direct contact DC may be formed in the direct contact hole DCH formed in the substrate 110 and extend to a level higher than an upper surface of the substrate 110. For example, an upper surface of the direct contact DC may be arranged on the same level as an upper surface of the lower conductive pattern 132A, and the upper surface of the direct contact DC may be in contact with a bottom surface of the intermediate conductive pattern 134A. Also, a bottom surface of the direct contact DC may be arranged at a level lower than that of the upper surface of the substrate 110.

A polysilicon layer 148 may be arranged between neighboring bit lines of the plurality of bit lines BL in a row in the second horizontal direction Y. The polysilicon layer 148 may extend long in a vertical direction (e.g., Z direction) from a recess space RS formed in the substrate 110. Opposite sidewalls of the polysilicon layer 148 in the second horizontal direction Y may be insulated from each other by a plurality of insulating fences 162. The plurality of insulating fences 162 may each include a silicon nitride film. The polysilicon layer 148 may form the plurality of buried contacts BC shown in FIG. 1.

A portion of the polysilicon layer 148 may cover at least a portion of an upper surface of the capping structure 140 to vertically overlap a portion of the plurality of bit lines BL. For example, a portion of the polysilicon layer 148 may vertically overlap the insulating layer 144, and may cover an upper surface of the insulating layer 144.

A portion of the polysilicon layer 148 may be electrically insulated from each other by an insulating pattern 180 filling an insulating space 180S of the polysilicon layer 148. The insulating pattern 180 may fill the insulating space 180S on an upper end of the bit line BL, and may cover opposite sidewalls of the capping structure 140.

In some embodiments, the insulating pattern 180 may include silicon nitride, silicon oxynitride, silicon oxide, or a combination thereof. In some embodiments, the insulating pattern 180 may include a two-layered structure including a first material layer and a second material layer, wherein the first material layer may include a low-k material, such as $SiO_2$, SiOCH, and SiOC, and the second material layer may include silicon nitride or silicon oxynitride. As used herein, the phrase "low-k material" may mean a material having a dielectric constant less than that of silicon oxide.

In the peripheral circuit area PCA, a peripheral circuit gate structure PGT may be formed on the second active area AC2. The peripheral circuit gate structure PGT may include a gate dielectric layer 116, a peripheral circuit gate electrode PG, and a gate capping pattern 142B, which are sequentially stacked on the second active area AC2.

The gate dielectric layer 116 may include a silicon oxide film, a silicon nitride film, a silicon oxynitride film, an oxide/nitride/oxide (ONO) film, and/or a high-k dielectric film, e.g., having a higher dielectric constant than that of a silicon oxide film. The peripheral circuit gate electrode PG may include a lower conductive pattern 132B, an intermediate conductive pattern 134B, and an upper conductive pattern 136B. Materials of the lower conductive pattern 132B, the intermediate conductive pattern 134B, and the upper conductive pattern 136B may be same as materials of the lower conductive pattern 132A, the intermediate conductive pattern 134A, and the upper conductive pattern 136A of the bit line BL in the cell array area MCA, respectively. The gate capping pattern 142B may include a silicon nitride film.

Opposite sidewalls of the peripheral circuit gate structure PGT may be covered with an insulating spacer PGS. The insulating spacer PGS may include an oxide film, a nitride film, or a combination thereof. The peripheral circuit gate structure PGT and the insulating spacer PGS may be covered with a protective film 144B. The protective film 144B may include a silicon nitride film. An interlayer insulating layer 149 may be formed around the peripheral circuit gate structure PGT on the protective film 144B. The interlayer insulating layer 149 may include Tonen SilaZene (TOSZ), but is not necessarily limited thereto. The peripheral circuit gate structure PGT, the protective film 144B, and the interlayer insulating layer 149 may be covered with an insulating fence 162. The insulating fence 162 may include a silicon nitride film.

The polysilicon layer 148 may be disposed on the insulating fence 162. The polysilicon layer 148 may have a flat upper surface to entirely cover the peripheral circuit gate structure PGT, and may extend in the first horizontal direction X and the second horizontal direction Y.

In the cell array area MCA, the polysilicon layer 148 may include a material having an etch selectivity with respect to materials of the insulating layer 144, the third spacer layer 156, the buried insulating layer 158, and the insulating fence 162. In some embodiments, the insulating layer 144 may include silicon nitride, and the buried insulating layer 158 may include silicon oxide. In addition, the insulating fence 162 may include a silicon nitride film, a silicon carbonitride film, or a combination thereof. Accordingly, the polysilicon layer 148 may include a material having an etch selectivity with respect to silicon nitride, silicon oxide, a silicon carbonitride film, or a combination thereof. It is noted that as used herein, the phrase "having an etch selectivity with respect to a material" means that the disclosed element and the stated material have different etch rates such that the disclosed element and the stated material may be selectively etched.

FIGS. 3A to 18 are cross-sectional views illustrating process sequences for explaining a method of manufacturing an integrated circuit device, according to embodiments. In particular, FIGS. 3A, 4A, 5A, 6A, 7A, 8 to 10, 11A, 12A, 13A, 14, 15A, 16A, and 17 are cross-sectional views corresponding to cross-sections taken along lines A1-A1' and A2-A2' of FIG. 1, and FIGS. 3B, 4B, 5B, 6B, 7B, 11B, 12B, 13B, 15B, and 16B are cross-sectional views corresponding to cross-sections taken along line B-B' of FIG. 1. Referring to FIGS. 3A to 18, a method of manufacturing the integrated circuit device 100 shown in FIGS. 1 to 2B is described with reference to FIGS. 3A to 18.

Figure 3A:
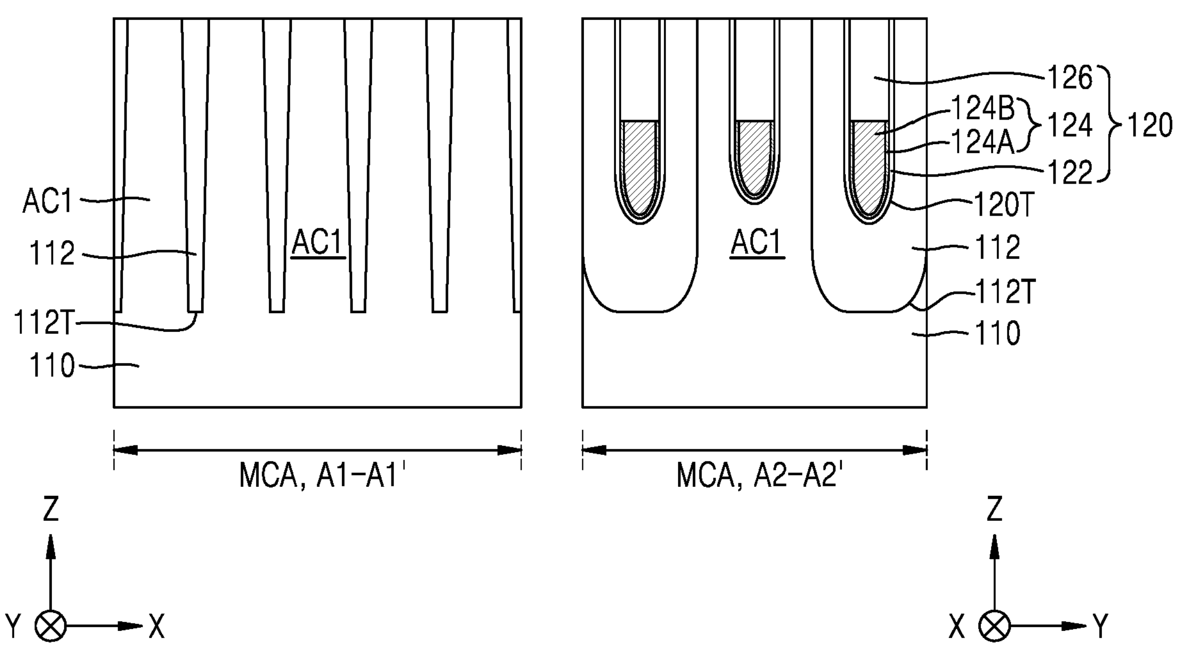
Figure 3B:
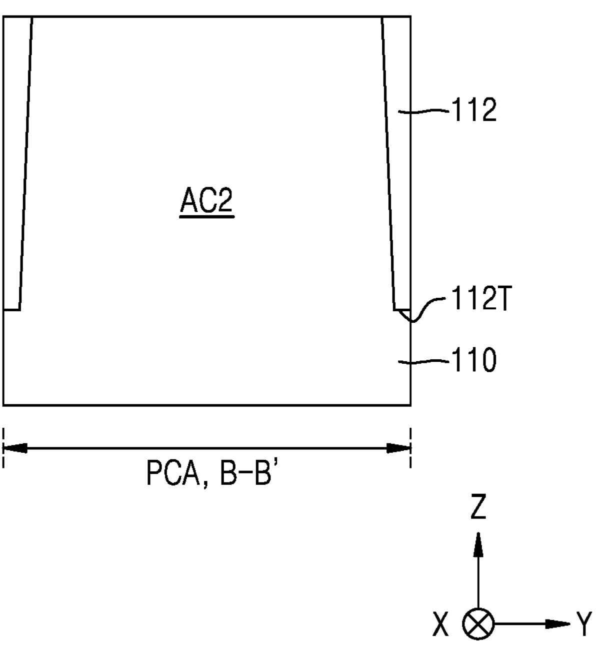

Referring to FIGS. 3A and 3B, a plurality of device isolation trenches 112T and a plurality of device isolation films 112 may be formed in the substrate 110 having the cell array area MCA and the peripheral circuit area PCA to define the plurality of first active areas AC1 in the cell array area MCA of the substrate 110, and the second active area AC2 may be defined in the peripheral circuit area PCA.

The plurality word line trenches 120T extending in parallel to each other may be formed in the cell array area MCA. After cleaning a product in which the plurality word line trenches 120T are formed, a plurality of gate dielectric films 122, a plurality of gate electrodes 124, and a plurality of capping insulating films 126 may be formed in the plurality word line trenches 120T. Impurity ions may be implanted into both side portions of the plurality of gate electrodes 124 in the plurality of first active areas AC1 to form a plurality of source/drain areas at an upper portion of the plurality of first active areas AC1.

The plurality of gate electrodes 124 may include the work function adjusting layer 124A on inner walls of the plurality of gate electrodes 124, and the buried conductive layer 124B. For example, the work function adjusting layer 124A and the buried conductive layer 124B may be sequentially formed on an inner wall of each of the plurality word line trenches 120T, and the plurality of gate electrodes 124 may be formed by removing portions of the work function adjusting layer 124A and the buried conductive layer 124B on an inner wall of the word line trench 120T by an etch-back operation.

Figure 4A:
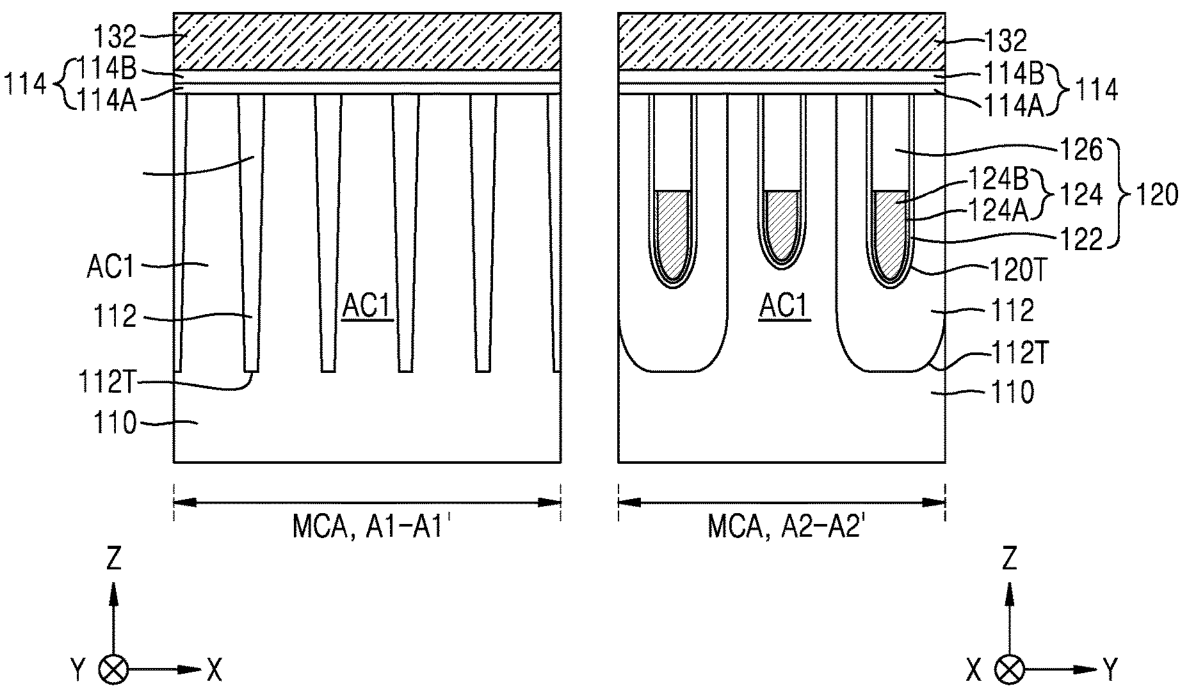
Figure 4B:
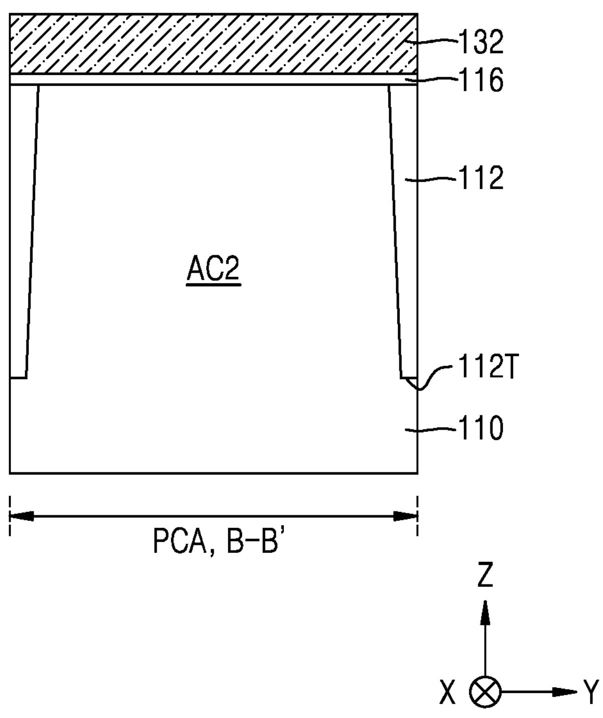

Referring to FIGS. 4A and 4B, the buffer film 114 including the first insulating film 114A and the second insulating film 114B may be formed on the substrate 110 in the cell array area MCA, and the gate dielectric layer 116 may be formed on the substrate 110 in the peripheral circuit area PCA.

Thereafter, a lower conductive layer 132 may be formed on the buffer film 114 in the cell array area MCA and the gate dielectric layer 116 in the peripheral circuit area PCA. In embodiments, the lower conductive layer 132 may include Si, Ge, W, WN, Co, Ni, Al, Mo, Ru, Ti, TiN, Ta, TaN, Cu, or a combination thereof. For example, the lower conductive layer 132 may include polysilicon.

Figure 5A:
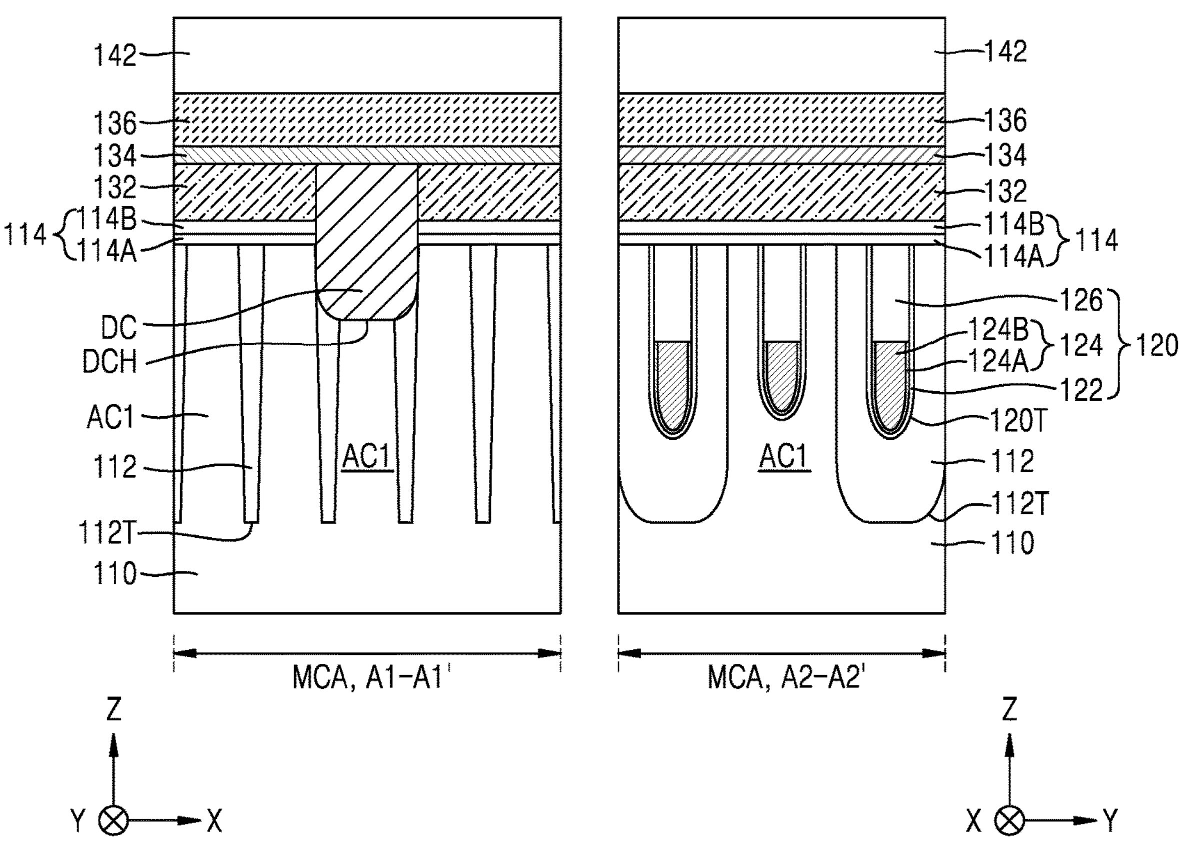
Figure 5B:
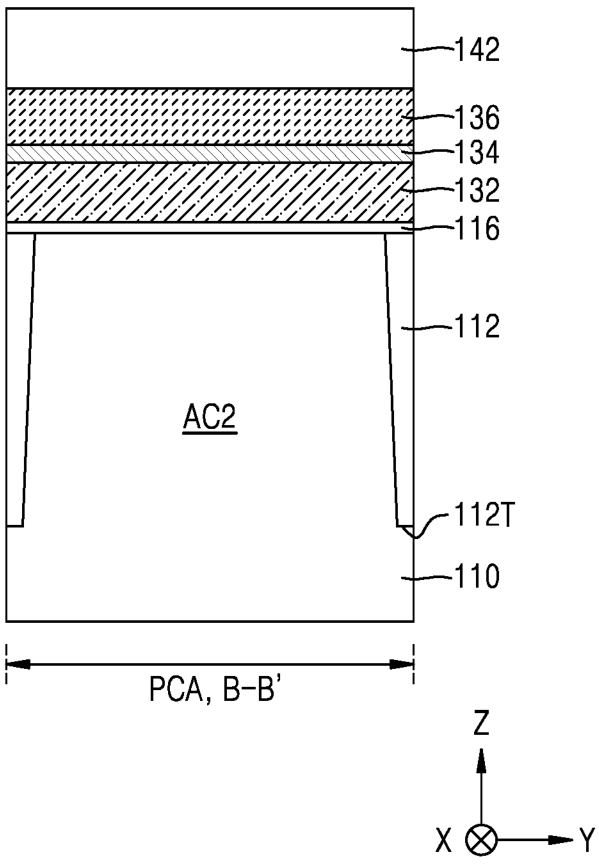

Referring to FIGS. 5A and 5B, after a first mask pattern is formed on the lower conductive layer 132, in the cell array area MCA, the lower conductive layer 132 exposed through an opening of the first mask pattern may be etched, and as a result, a portion of the substrate 110 and a portion of the device isolation film 112, which are exposed, may be etched to form the direct contact hole DCH exposing the first active area AC1 of the substrate 110.

Thereafter, the first mask pattern is removed, and the direct contact DC is formed in the direct contact hole DCH. In an example of an operation of forming the direct contact DC, a conductive layer having a thickness that is sufficient to fill the direct contact hole DCH may be formed in the direct contact hole DCH and on the lower conductive layer 132, and the conductive layer may be etched back so that the conductive layer remains only in the direct contact hole DCH. The conductive layer may include polysilicon.

Thereafter, an intermediate conductive layer 134, an upper conductive layer 136, and the lower capping layer 142 may be sequentially formed on the lower conductive layer 132 and the direct contact DC in the cell array area MCA and the peripheral circuit area PCA. The intermediate conductive layer 134 and the upper conductive layer 136 may each include TiN, TiSiN, W, tungsten silicide, or a combination thereof. The lower capping layer 142 may include a silicon nitride film.

Figure 6A:
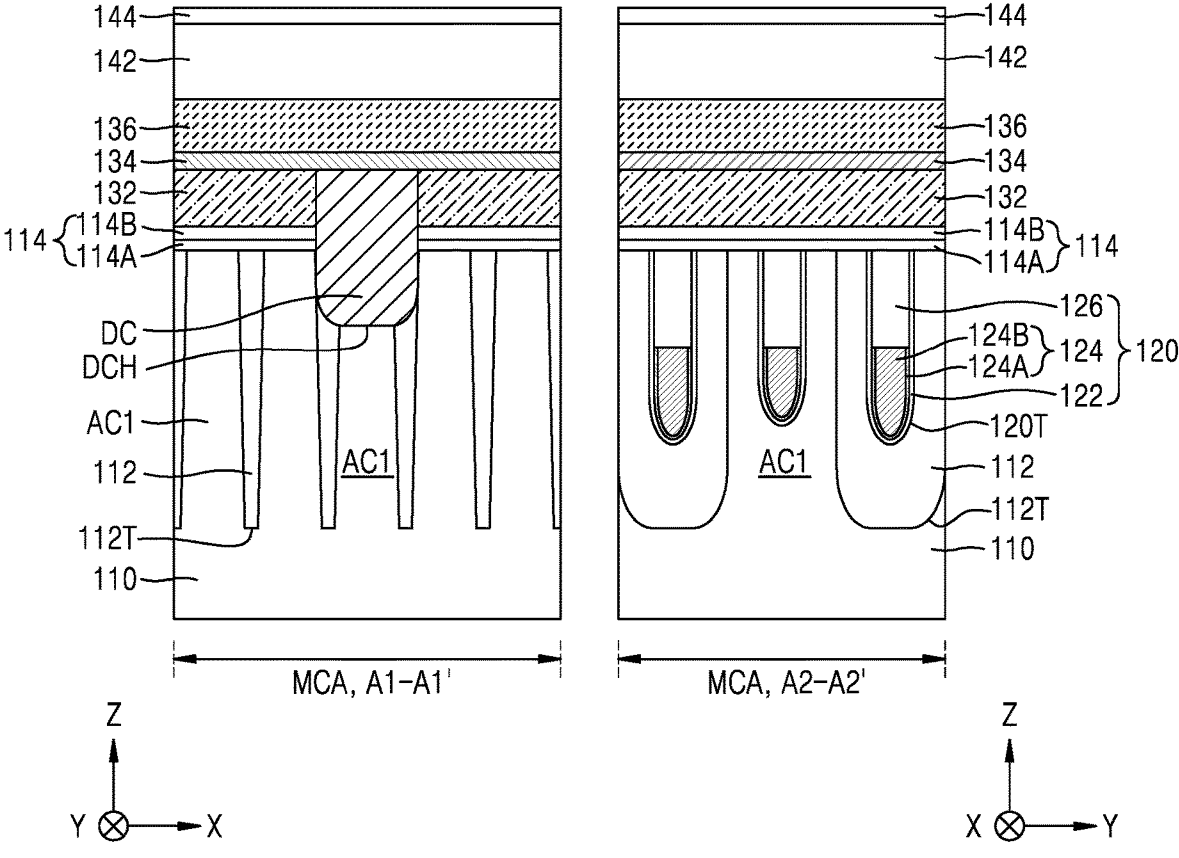
Figure 6B:
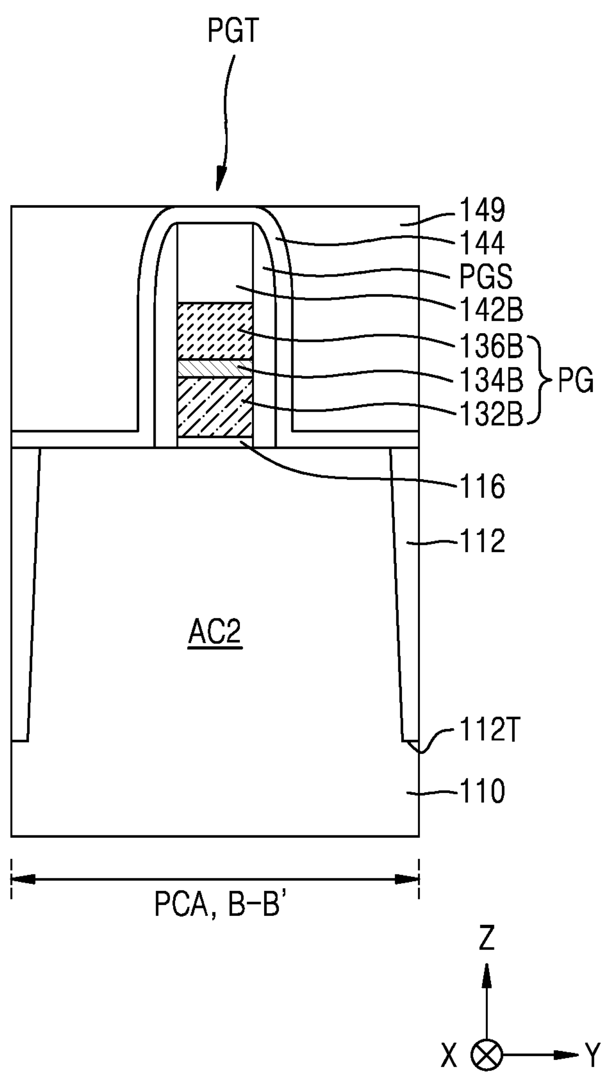

Referring to FIGS. 6A and 6B, in a state in which the cell array area MCA is covered with a mask pattern, in the peripheral circuit area PCA, the gate dielectric layer 116, the lower conductive layer 132, the intermediate conductive layer 134, the upper conductive layer 136, and the lower capping layer 142 are patterned to form a peripheral circuit gate electrode PG including the lower conductive pattern 132B, the intermediate conductive pattern 134B, and the upper conductive pattern 136B on the gate dielectric layer 116, and the gate capping pattern 142B covering the peripheral circuit gate electrode PG. Thereafter, the insulating spacer PGS is formed on opposite sidewalls of the peripheral circuit gate structure PGT including a stacked structure of the gate dielectric layer 116, the peripheral circuit gate electrode PG, and the gate capping pattern 142B, and an ion implantation operation of forming source/drain areas in the second active area AC2 is performed on both sides of the peripheral circuit gate structure PGT.

Thereafter, the mask pattern covering the cell array area MCA may be removed to expose the lower capping layer 142 in the cell array area MCA, and the insulating layer 144 covering the lower capping layer 142 in the cell array area MCA and covering the peripheral circuit gate structure PGT and the insulating spacer PGS in the peripheral circuit area PCA may be formed. Thereafter, in the peripheral circuit area PCA, the interlayer insulating layer 149 filling a space around the peripheral circuit gate structure PGT may be formed.

Figure 7A:
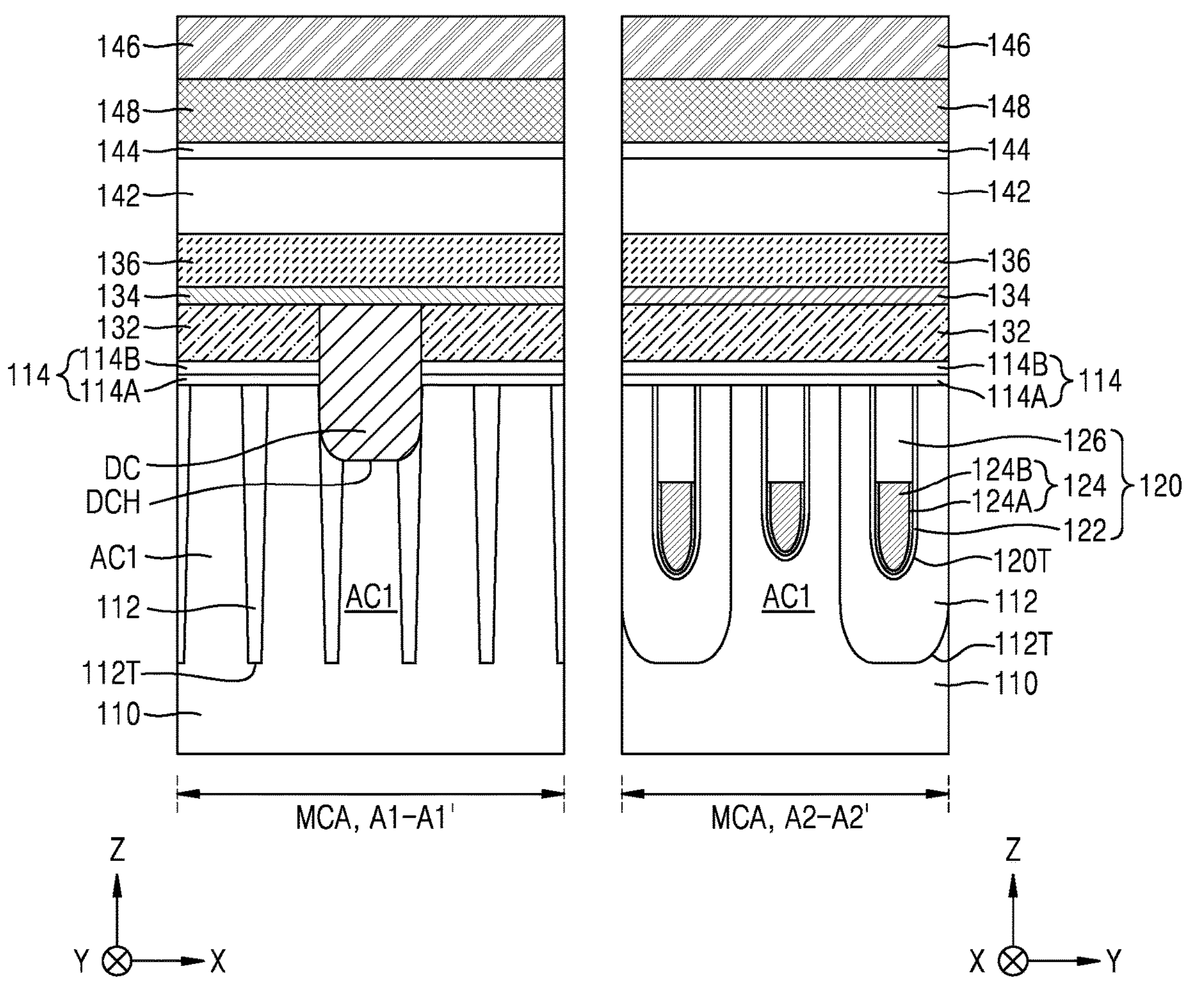
Figure 7B:
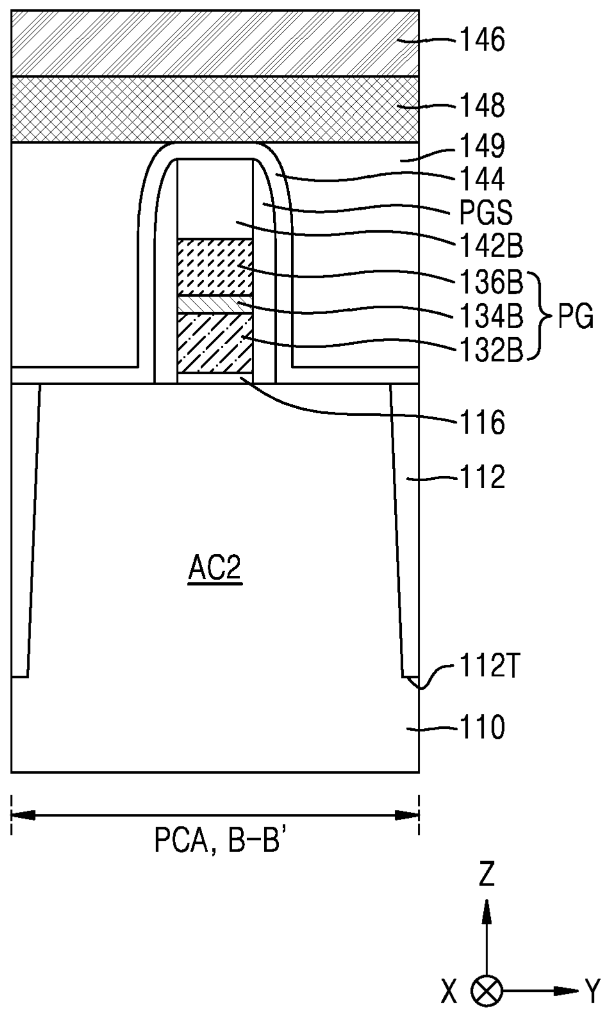

Referring to FIGS. 7A and 7B, in the cell array area MCA and the peripheral circuit area PCA, the polysilicon layer 148 covering the insulating layer 144 may be formed. At this time, the polysilicon layer 148 may cover an entire upper surface of the insulating layer 144. As the polysilicon layer 148 covers the entire upper surface of the insulating layer 144, in a subsequent operation using an etch selectivity, the insulating layer 144 below the polysilicon layer 148 might not be etched. The polysilicon layer 148 may include a material having an etch selectivity with respect to the insulating layer 144. For example, the insulating layer 144 may include silicon nitride, and the polysilicon layer 148 may include a material having an etch selectivity with respect to silicon nitride. An upper insulating capping layer 146 may be formed on the polysilicon layer 148. The upper insulating capping layer 146 may include a silicon nitride film, a silicon carbonitride film, or a combination thereof. The polysilicon layer 148 may include doped polysilicon. For example, the polysilicon layer 148 may include polysilicon containing an n-type impurity, such as P, As, Bi, and Sb, at a relatively high concentration.

Figure 8:
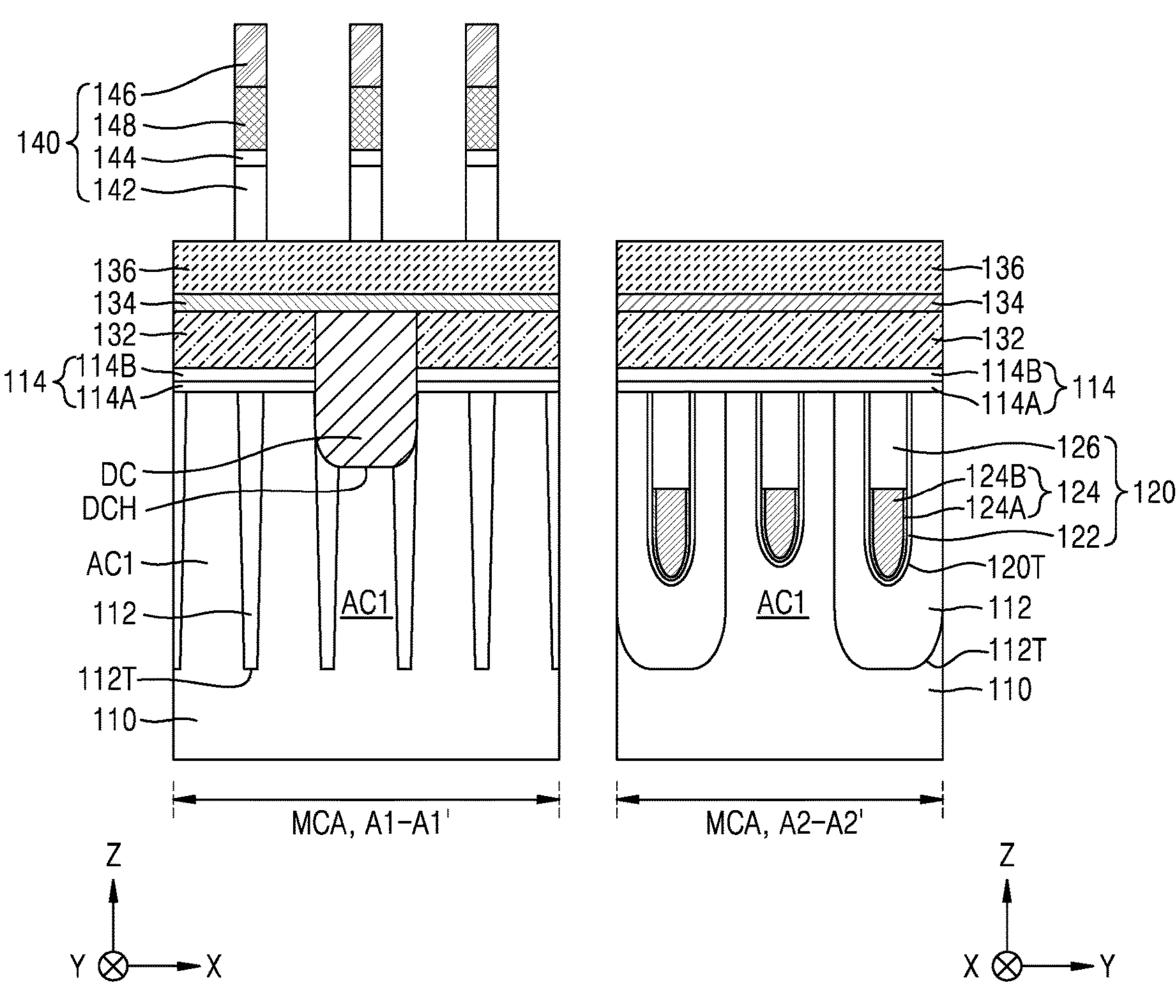

Referring to FIG. 8, a mask pattern may be formed in the peripheral circuit area PCA, and in the cell array area MCA, the upper insulating capping layer 146, the polysilicon layer 148, the insulating layer 144, and the lower capping layer 142 may be patterned. Here, the lower capping layer 142, the insulating layer 144, the polysilicon layer 148, and the upper insulating capping layer 146 are referred to as the capping structure 140.

Figure 9:
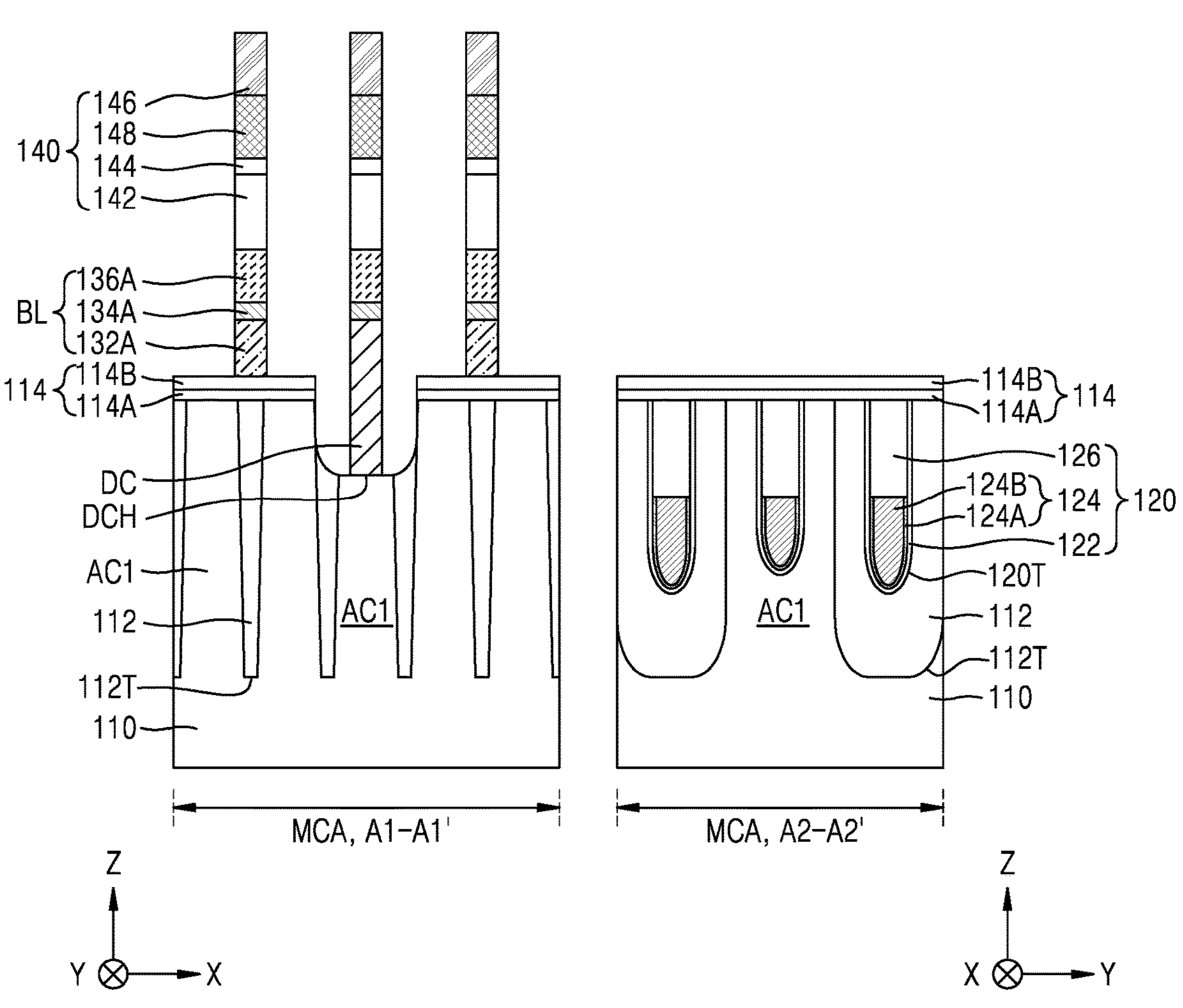

Referring to FIG. 9, in the cell array area MCA, the lower capping layer 142, the insulating layer 144, the polysilicon layer 148, and the upper insulating capping layer 146 are used as an etching mask to etch the upper conductive layer 136, the intermediate conductive layer 134, and the lower conductive layer 132 to form the plurality of bit lines BL including the lower conductive pattern 132B, the intermediate conductive pattern 134B, and the upper conductive pattern 136B.

In an operation of forming the plurality of bit lines BL, a portion of sidewalls of the direct contact DC may be removed, and a portion of the direct contact hole DCH may be exposed.

Figure 10:
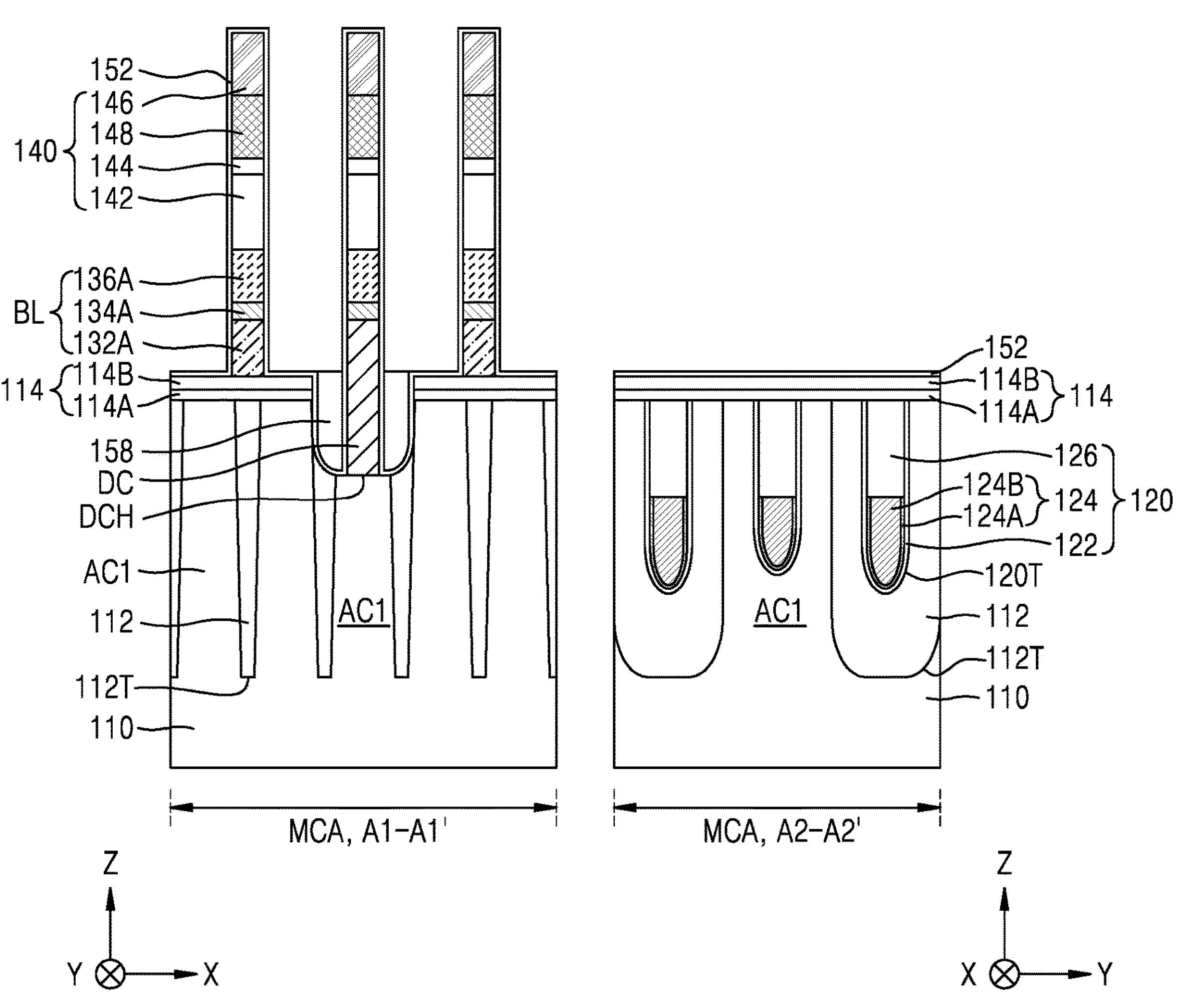

Referring to FIG. 10, the first spacer layer 152 may be formed on the sidewalls of the plurality of bit lines BL and the sidewalls of the direct contact DC. Thereafter, an insulating layer having a thickness that is sufficient to fill the inside of the direct contact hole DCH is formed on the sidewalls of the plurality of bit lines BL and the sidewalls of the direct contact DC, and subsequently, an anisotropic etching operation may be performed on the insulating layer so that the buried insulating layer 158 filling the inside of the direct contact hole DCH may remain.

Figure 11A:
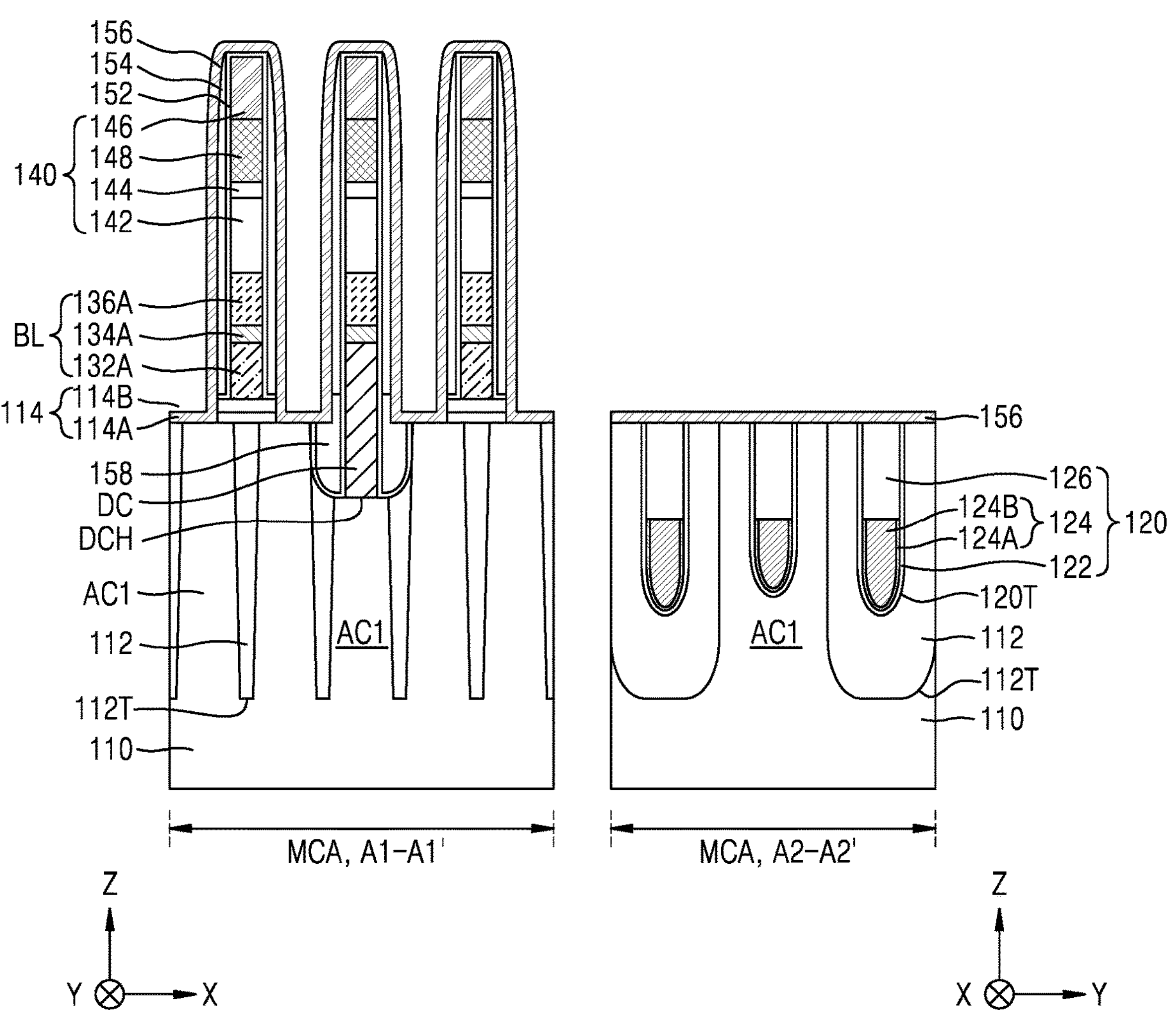

Referring to FIG. 11A, the second spacer layer 154 covering the first spacer layer 152 may be formed on the sidewalls of the plurality of bit lines BL. A portion of the buffer film 114 between neighboring bit lines of the plurality of bit lines BL may be removed by using the second spacer layer 154 as an etch mask, and an upper surface of the second spacer layer 154 may be exposed. At this time, a portion of the buried insulating layer 158 may also be removed together.

Thereafter, the third spacer layer 156 may be formed on the sidewalls of the plurality of bit lines BL and the upper surface of the substrate 110.

Figure 11B:
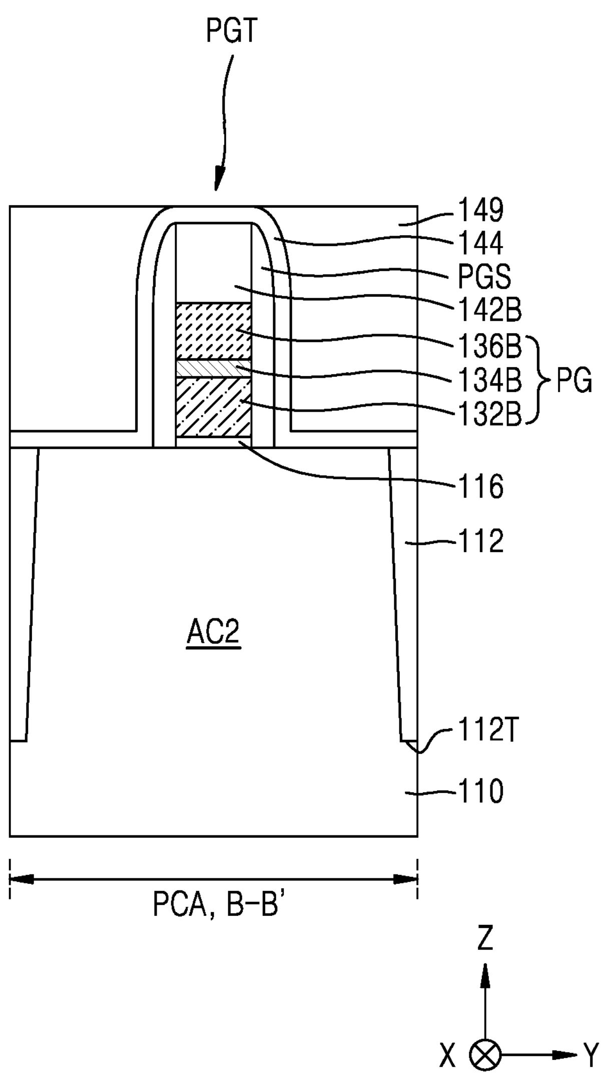

Referring to FIG. 11B, a mask pattern may be formed in the cell array area MCA, and in the peripheral circuit area PCA, the upper insulating capping layer 146 formed on the polysilicon layer 148 may be etched. The polysilicon layer 148 may include a material having an etch selectivity with respect to the upper insulating capping layer 146 and the insulating layer 144. For example, the upper insulating capping layer 146 may include a silicon nitride film, a silicon carbonitride film, or a combination thereof, and the insulating layer 144 may include a silicon nitride film. The polysilicon layer 148 may include a material having an etch selectivity with respect to a silicon nitride film, a silicon carbonitride film, or a combination thereof. For example, the polysilicon layer 148 may include polysilicon containing an n-type impurity, such as P, As, Bi, and Sb, at a relatively high concentration. An operation of etching the upper insulating capping layer 146 and the insulating layer 144 may be an etching operation using an etch selectivity. For example, the operation may be an operation in which the upper insulating capping layer 146 is etched at a relatively high rate while the polysilicon layer 148 is barely removed. After the upper insulating capping layer 146 is etched, the polysilicon layer 148 formed to cover the entire upper surface of the insulating layer 144 may be etched. At this time, the polysilicon layer 148 may be etched at a relatively high rate while the insulating layer 144 is barely removed.

Figure 12A:
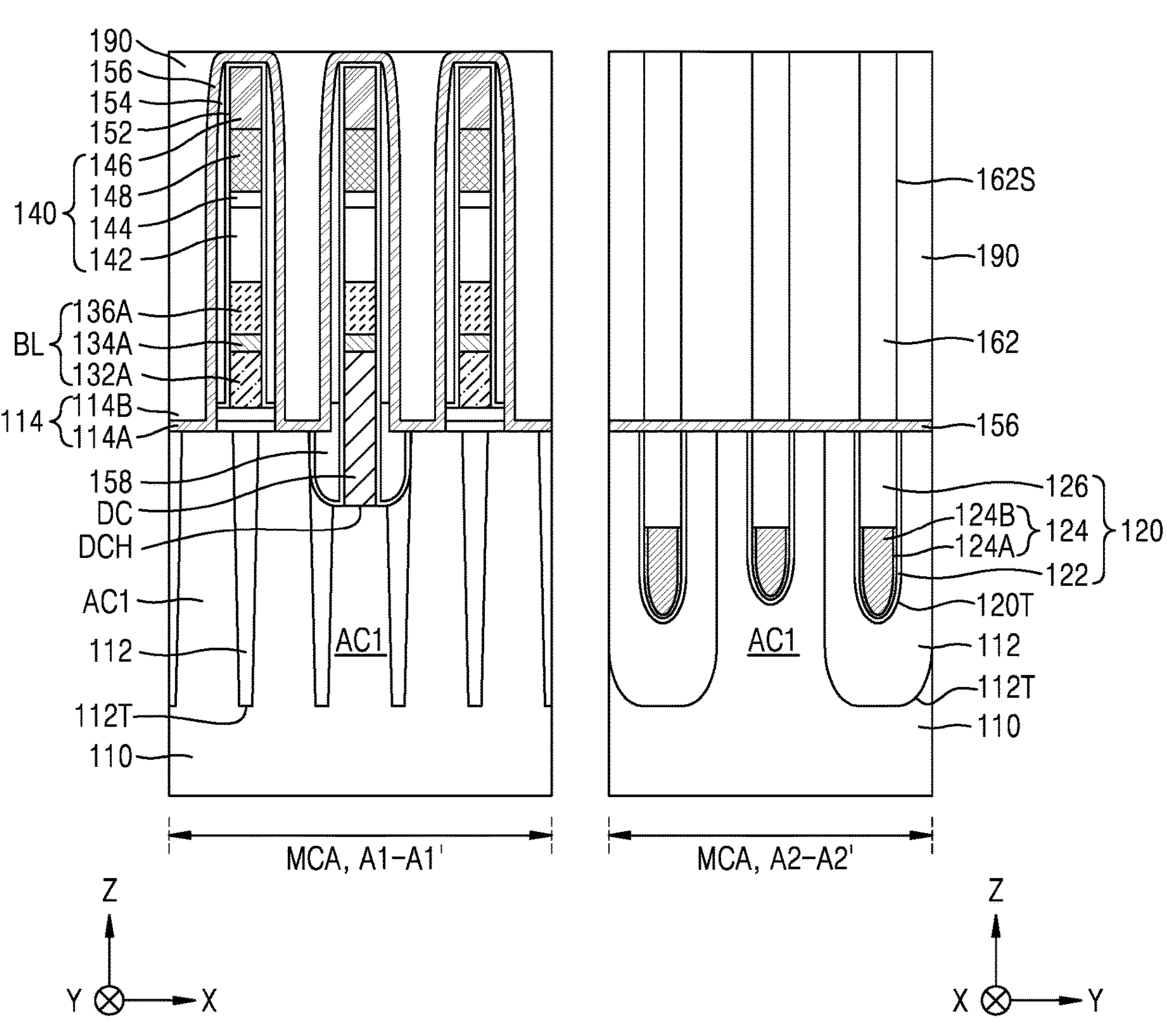
Figure 12B:
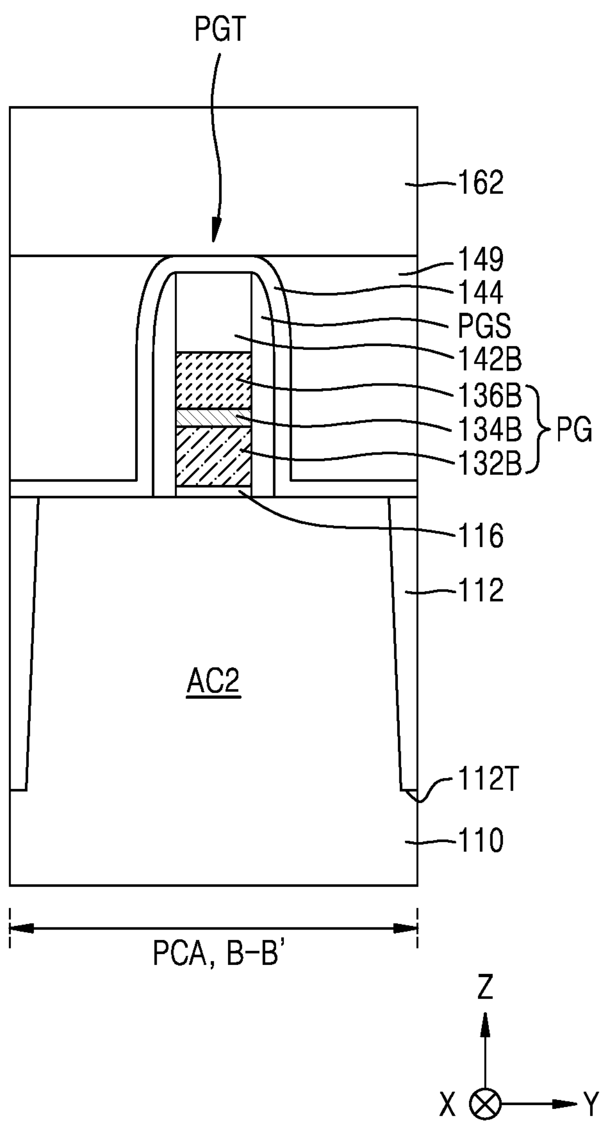

Referring to FIGS. 12A and 12B, the plurality of insulating fences 162 may be formed between neighboring bit lines of the plurality of bit lines BL in the cell array area MCA. For example, the plurality of insulating fences 162 may vertically overlap the plurality word line trenches 120T, and upper surfaces of the plurality of insulating fences 162 may be arranged at the same level as that of an upper surface of the third spacer layer 156.

The plurality of insulating fences 162 may be spaced apart from each other in the second horizontal direction Y, and accordingly, a contact space 162S may be defined between two adjacent insulating fences 162 among the plurality of insulating fences 162 and between two bit lines BL. Thereafter, the contact space 162S between the insulating fences 162 may be filled with an insulating material, and an upper portion of the insulating material may be planarized to form a buried layer 190 in the contact space 162S. For example, the buried layer 190 may be formed by using silicon oxide. In the peripheral circuit area PCA, the insulating fence 162 may be formed on the insulating layer 144 and the interlayer insulating layer 149. For example, the insulating fence 162 may vertically overlap the peripheral circuit gate structure PGT.

Figure 13A:
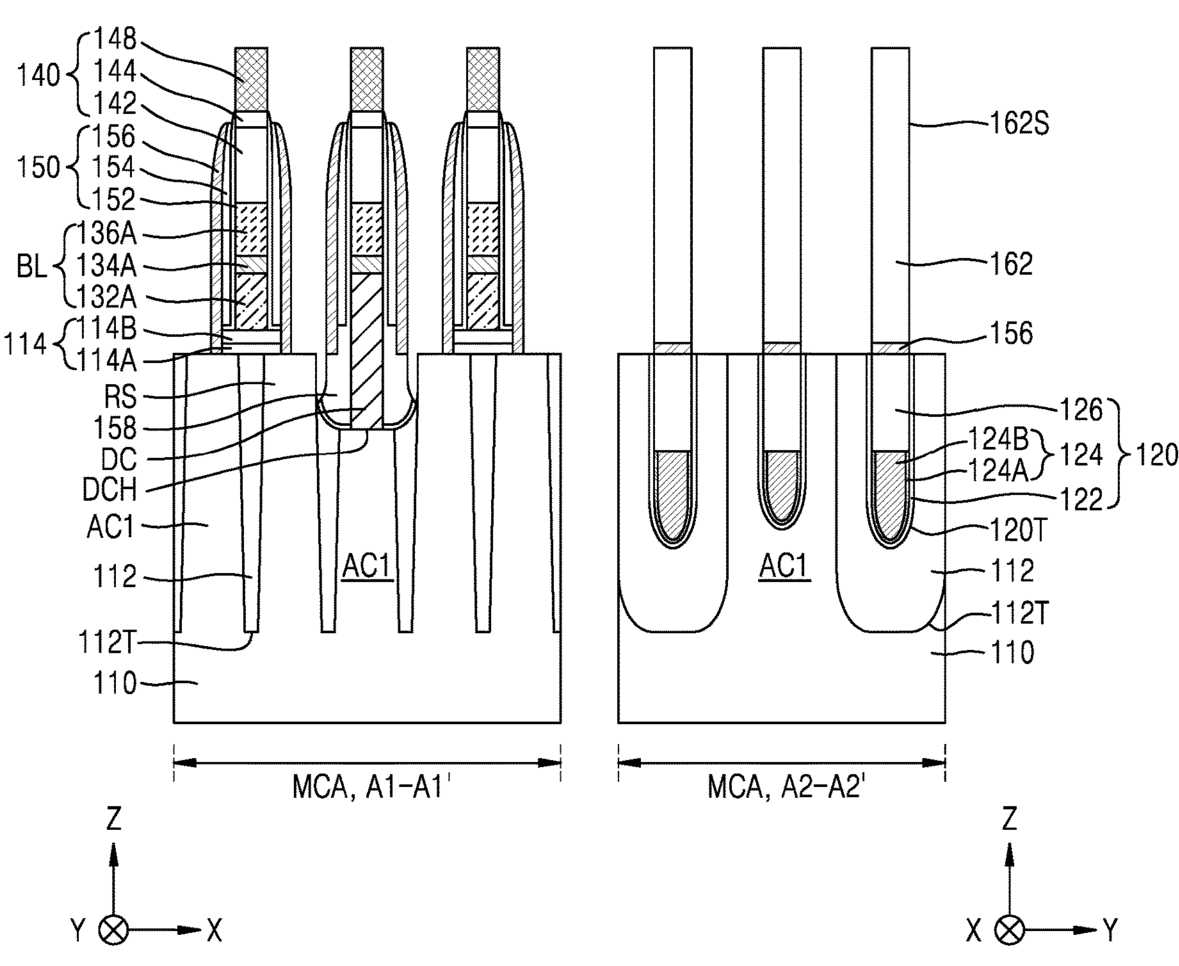

Referring to FIG. 13A, in the cell array area MCA, the upper insulating capping layer 146, the third spacer layer 156, the buried layer 190, and upper portions of insulating fences 162 may be removed to expose the plurality of contact spaces 162S.

An etching operation of forming the plurality of contact spaces 162S may be an etching operation using an etch selectivity. For example, while the polysilicon layer 148 is barely removed, the upper insulating capping layer 146, the third spacer layer 156, the buried layer 190, and the insulating fence 162 may be etched at a relatively high rate. Accordingly, in the capping structure 140, the upper insulating capping layer 146 may be completely etched, and only the polysilicon layer 148 may be exposed. Because the polysilicon layer 148 is barely removed in an operation in which the upper insulating capping layer 146 is etched, the polysilicon layer 148 may serve as a barrier to protect the insulating layer 144 therebelow. As the polysilicon layer 148 is configured to serve as a barrier protecting the insulating layer 144, even when the upper insulating capping layer 146 is formed thinner, the insulating layer 144 and the bit line BL might not be etched in an operation of etching the upper insulating capping layer 146. Accordingly, a vertical height of a capping structure may be further reduced.

Figure 13B:
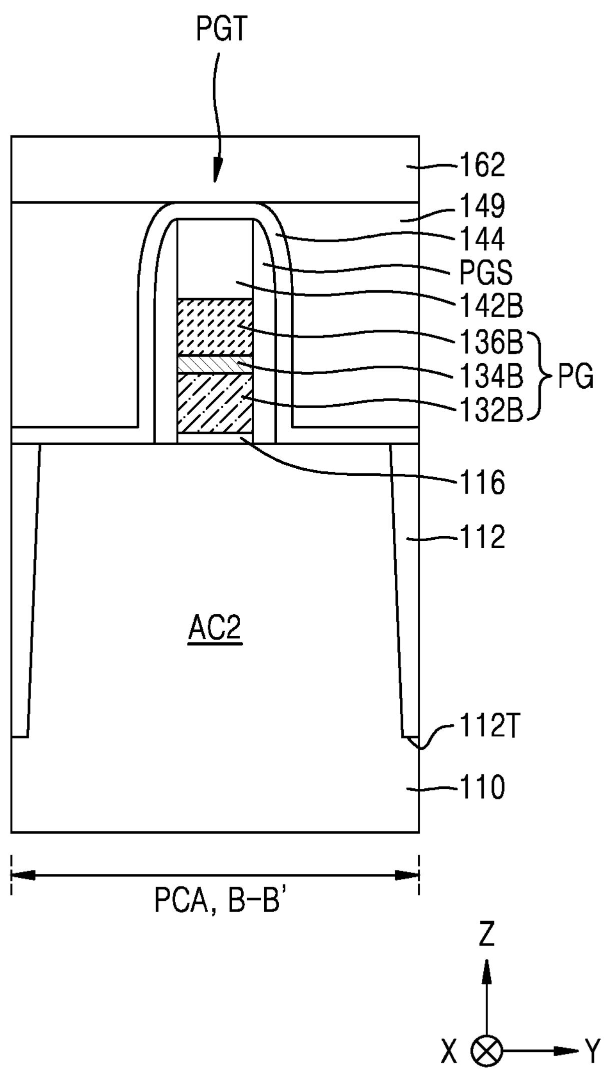

Referring to FIG. 13B, in the peripheral circuit area PCA, the insulating fence 162 including silicon nitride may be etched at a relatively high rate through an etching operation using an etch selectivity. Accordingly, the thickness of the insulating fence 162 formed on the insulating layer 144 and the interlayer insulating layer 149 may be reduced through the etching operation.

Figure 14:
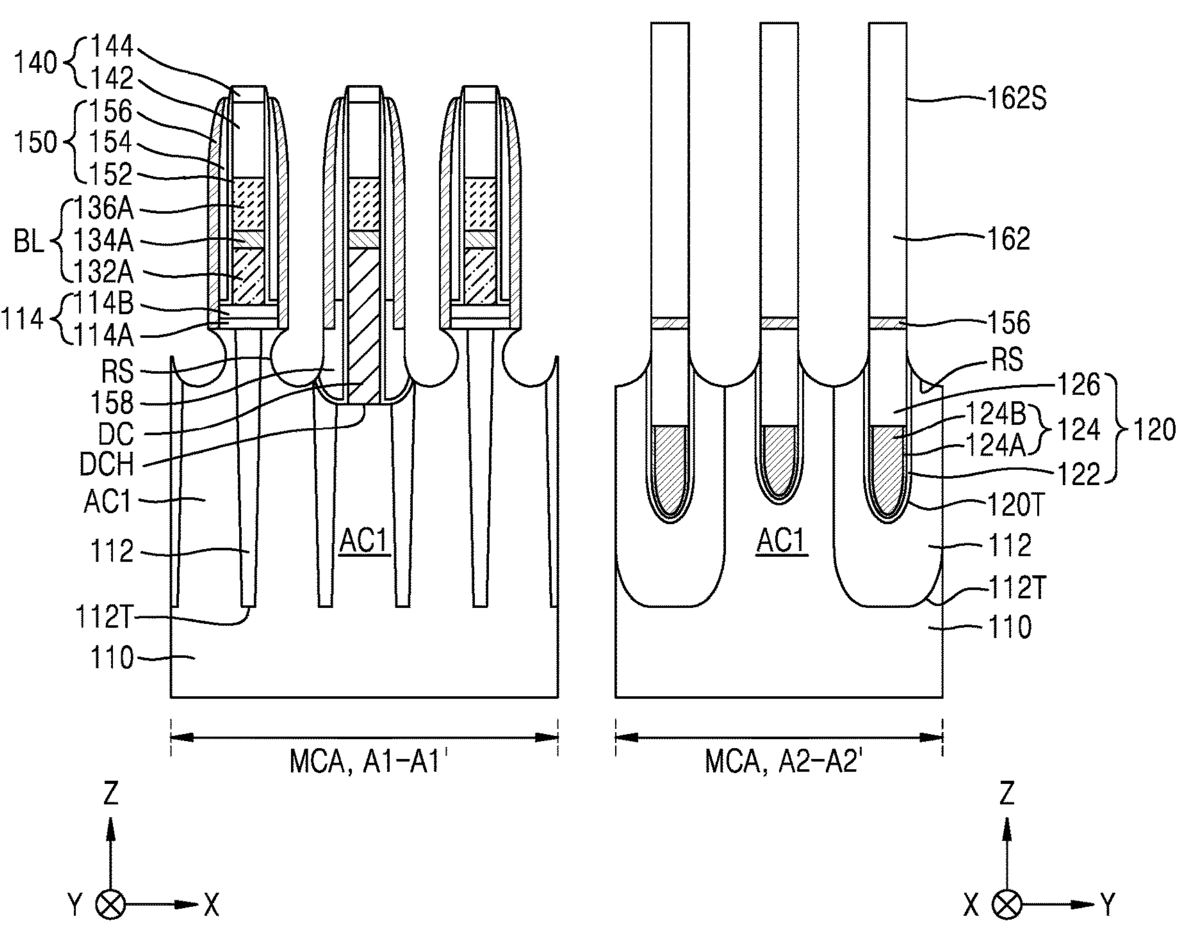

Referring to FIG. 14, in the cell array area MCA, a portion of the buffer film 114 and the substrate 110, which are arranged on the bottom of the plurality of contact spaces 162S, is removed to form a plurality of recess spaces RS exposing the first active area AC1 of the substrate 110 between neighboring bit lines of the plurality of bit lines BL. Thereafter, the polysilicon layer 148 may be etched. An operation of etching the polysilicon layer 148 may be an operation using an etch selectivity. For example, while the insulating layer 144, the third spacer layer 156, the buried layer 190, and the insulating fence 162 are barely removed, the polysilicon layer 148 may be etched at a relatively high rate. According, the polysilicon layer 148 may be completely etched, and only the insulating layer 144 may be exposed.

Figure 15A:
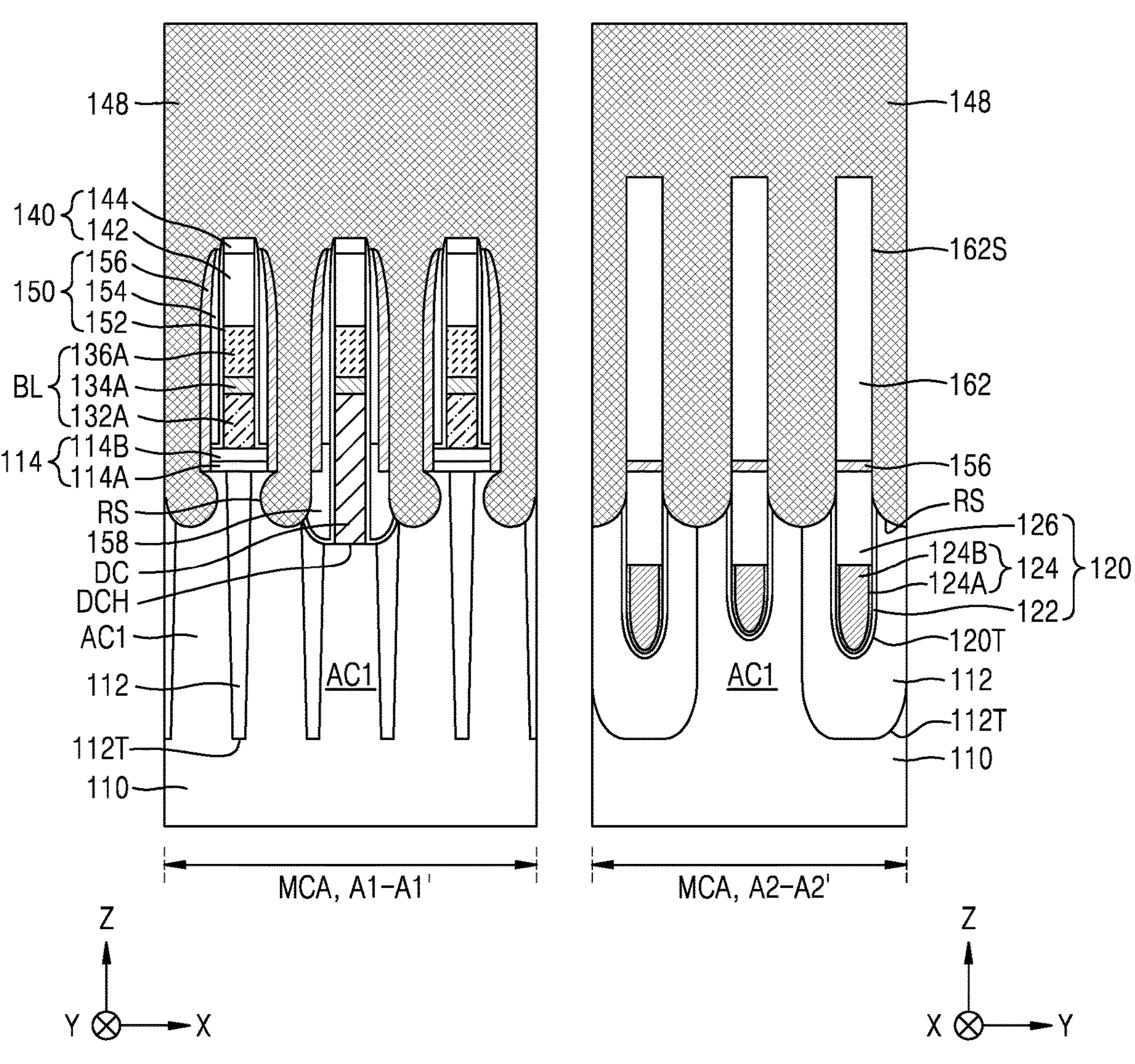
Figure 15B:
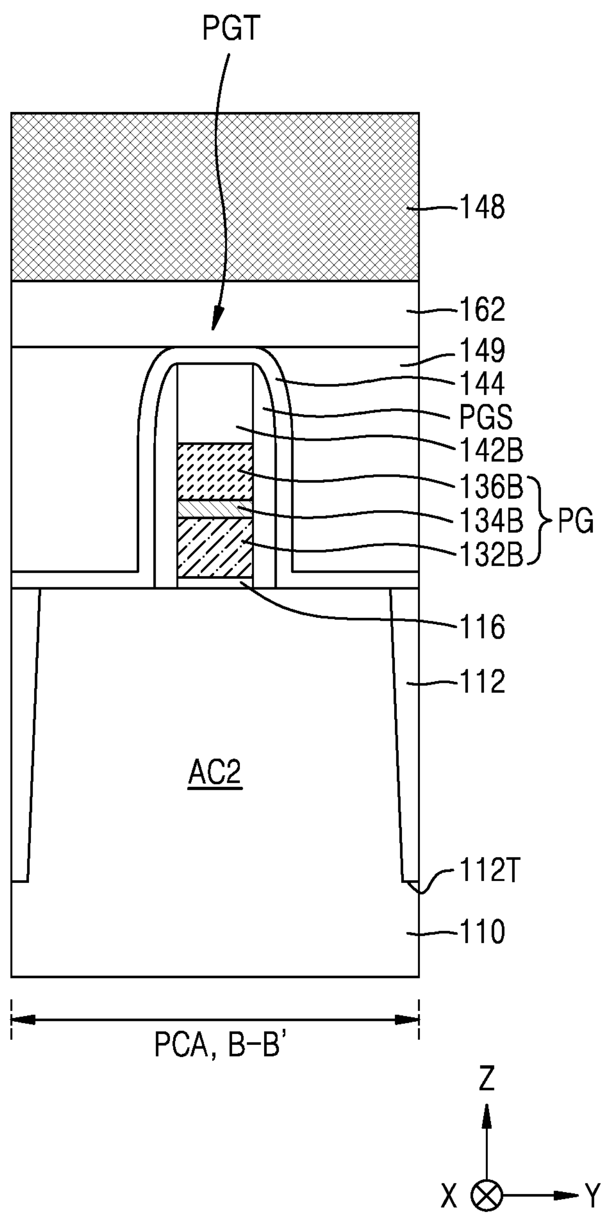

Referring to FIGS. 15A to 15B, in the cell array area MCA, the polysilicon layer 148 filling a portion of the contact space 162S between neighboring bit lines of the plurality of bit lines BL while filling the plurality of recess spaces RS between neighboring bit lines of the plurality of bit lines BL may be formed. The polysilicon layer 148 may cover an upper surface of the bit line BL and outer surfaces of the spacer structure 150. The bit line BL may include the upper conductive pattern 136A, and an upper surface of the polysilicon layer 148 may be positioned higher than an upper surface of the upper conductive pattern 136A. The upper conductive pattern 136A may include tungsten. In the peripheral circuit area PCA, the polysilicon layer 148 may be formed on the insulating fence 162. The polysilicon layer 148 may vertically overlap the peripheral circuit gate structure PGT. The polysilicon layer 148 may cover an entire upper surface of the peripheral circuit gate structure PGT.

Figure 16A:
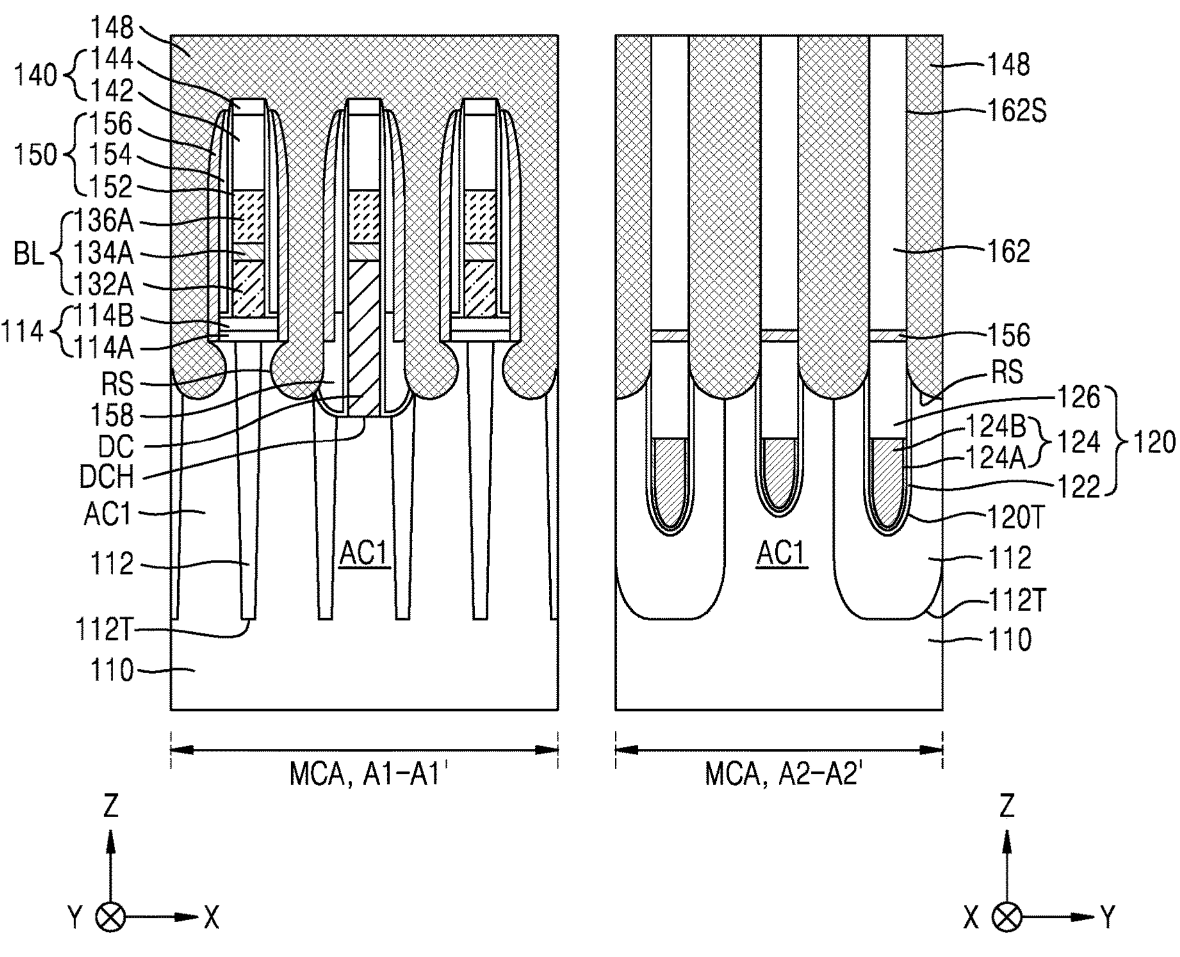
Figure 16B:
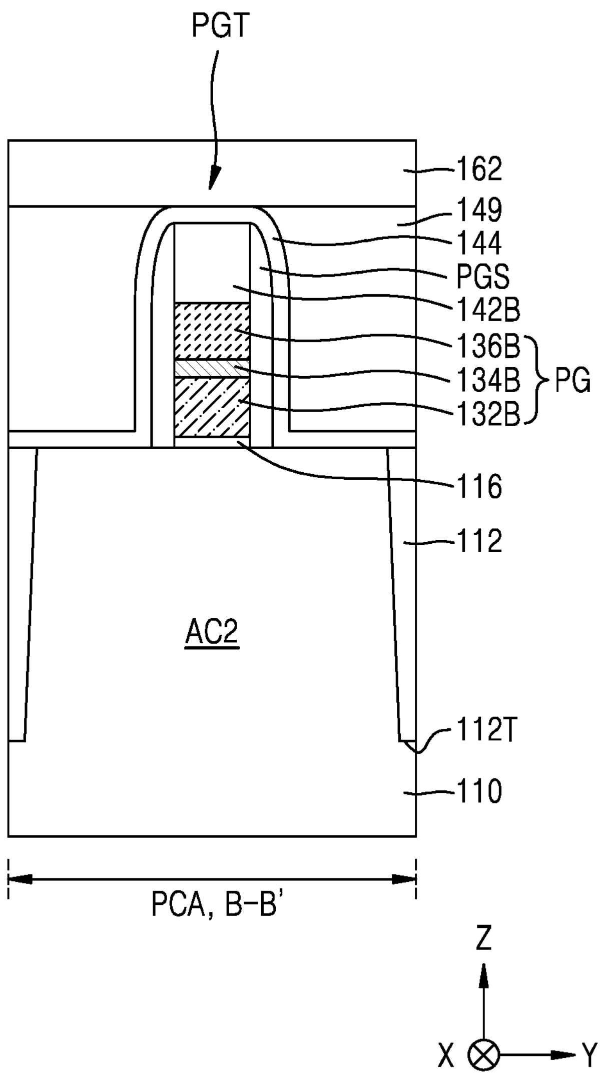

Referring to FIGS. 16A and 16B, in the cell array area MCA and the peripheral circuit area PCA, the polysilicon layer 148 may be etched. An operation of etching the polysilicon layer 148 may be an operation using an etch selectivity. In the cell array area MCA, a portion of the polysilicon layer 148 may be etched, and in the peripheral circuit area PCA, the polysilicon layer 148 may be completely etched.

Figure 17:
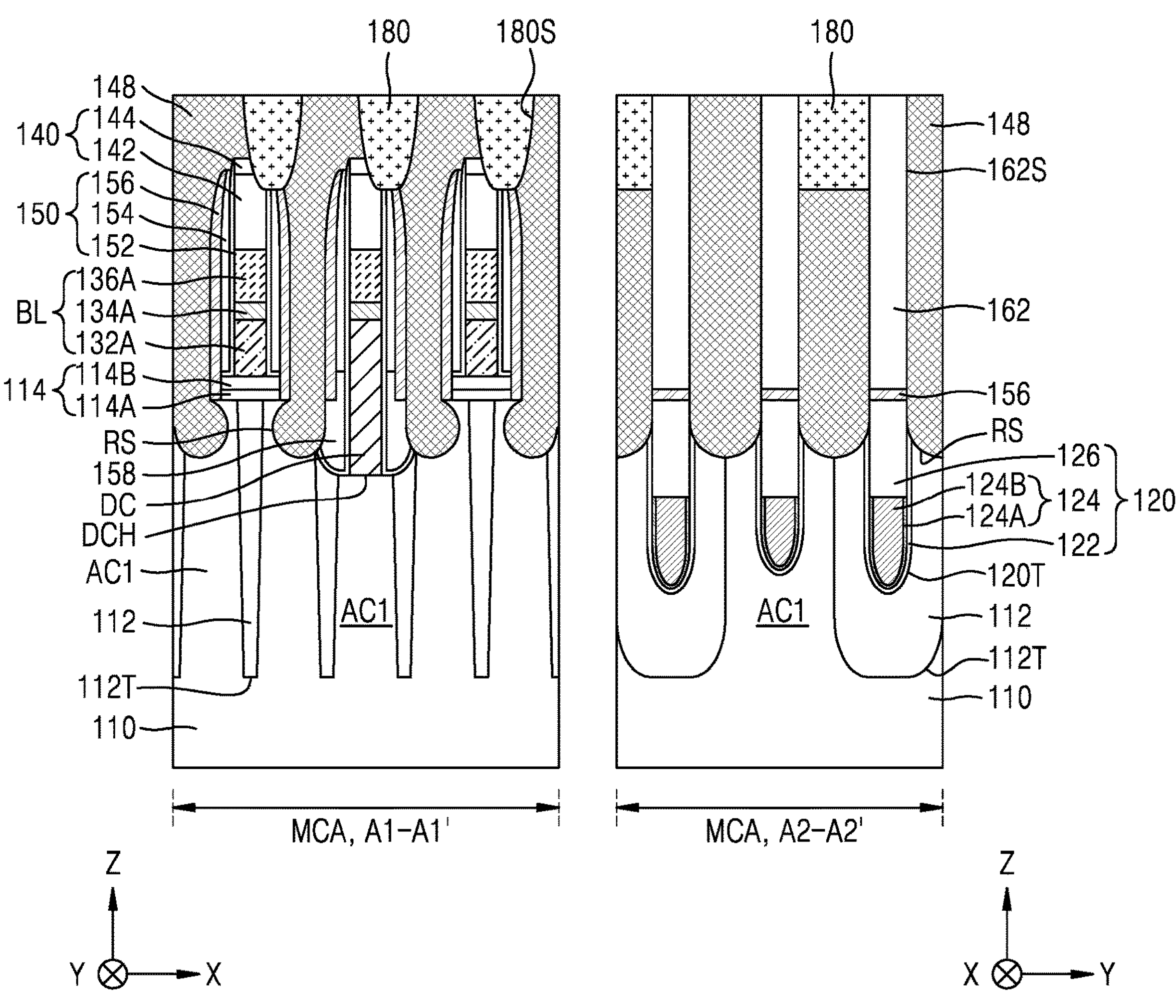

Referring to FIG. 17, in the cell array area MCA, the polysilicon layer 148 may be patterned to form the insulating space 180S. At this time, the insulating layer 144 and the lower capping layer 142 may be exposed on an inner wall of the insulating space 180S. Thereafter, the insulating pattern 180 may be formed on the inner wall of the insulating space 180S by using an insulating material. The insulating pattern 180 may be formed by spin coating, a chemical vapor deposition (CVD) operation, a flowable CVC operation, or the like.

Thereafter, in the cell array area MCA, a capacitor lower electrode may be formed on the polysilicon layer 148.

The integrated circuit device 100 is completed according to the manufacturing method described above.

Figure 18:
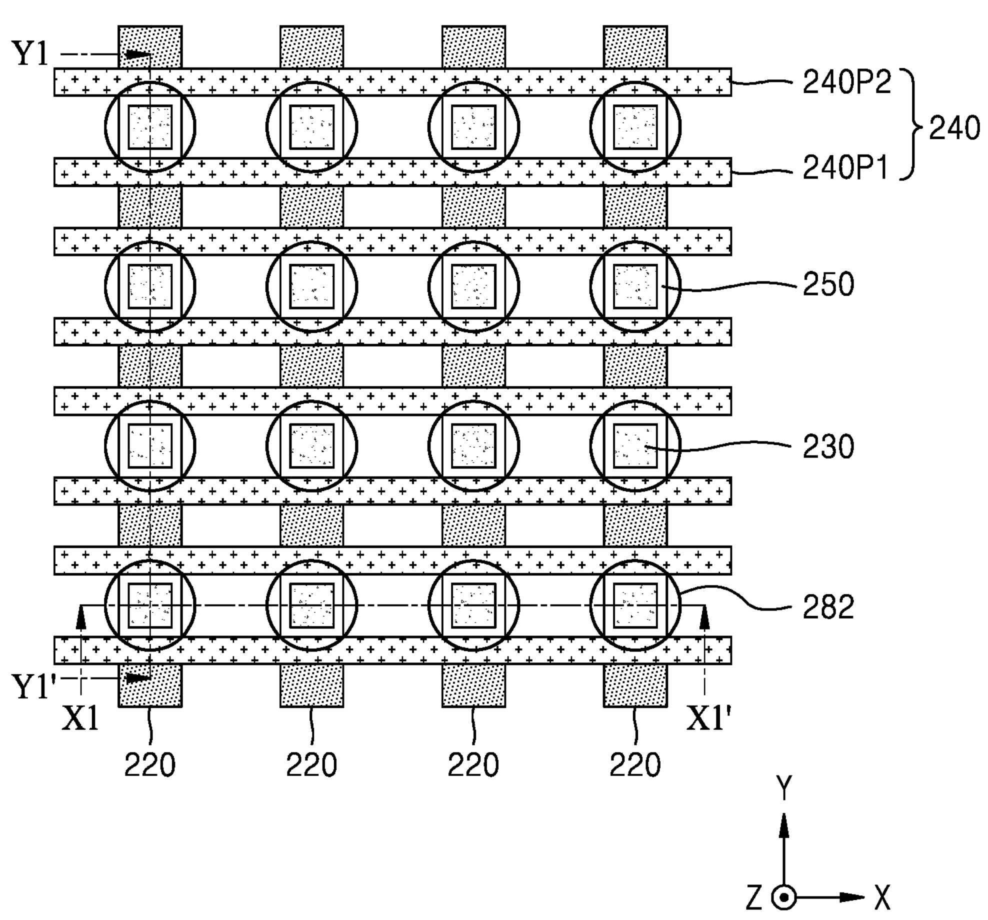
Figure 19:
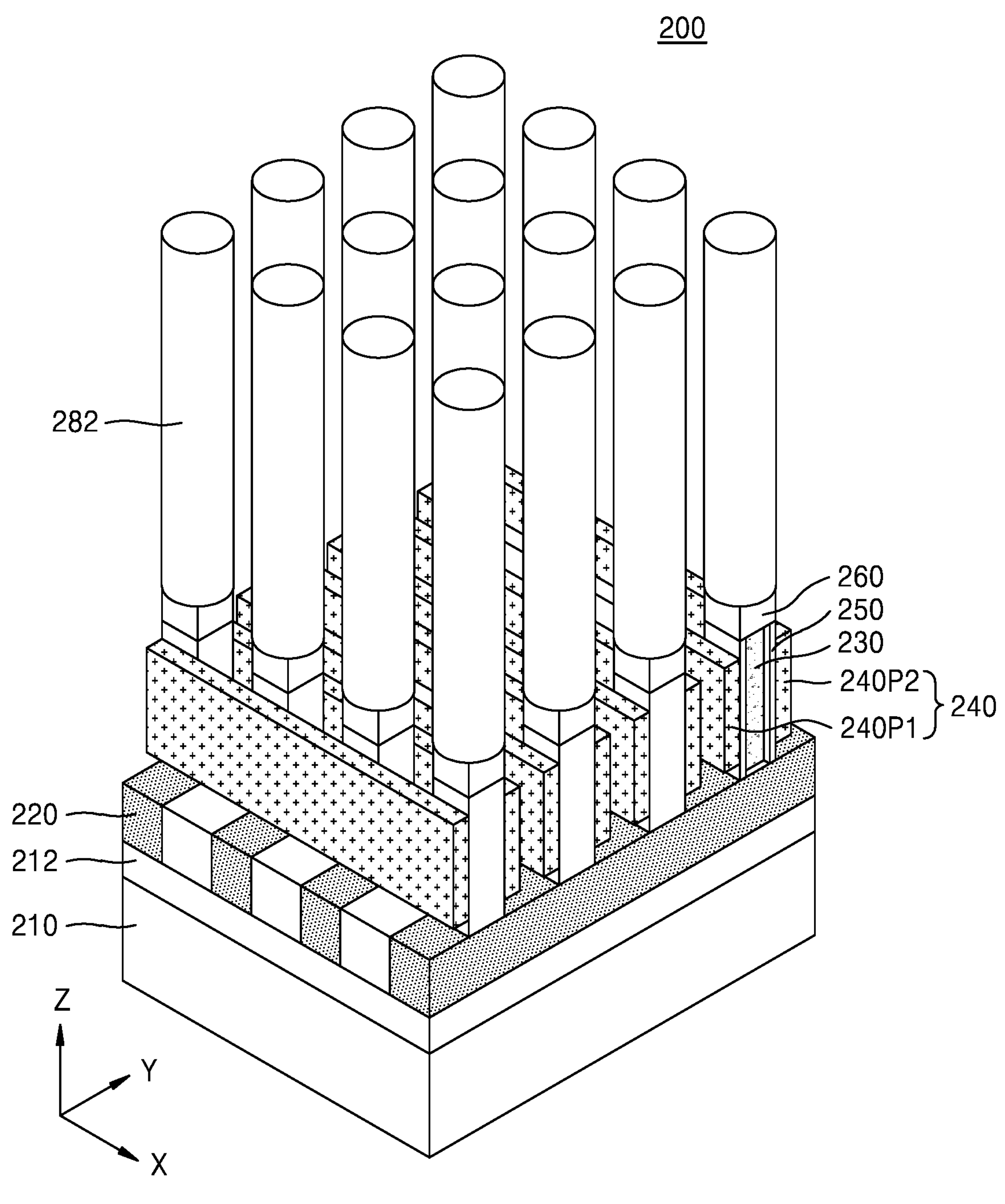
FIG. 19 is a perspective view illustrating the integrated circuit device of FIG. 18.
Figure 20:
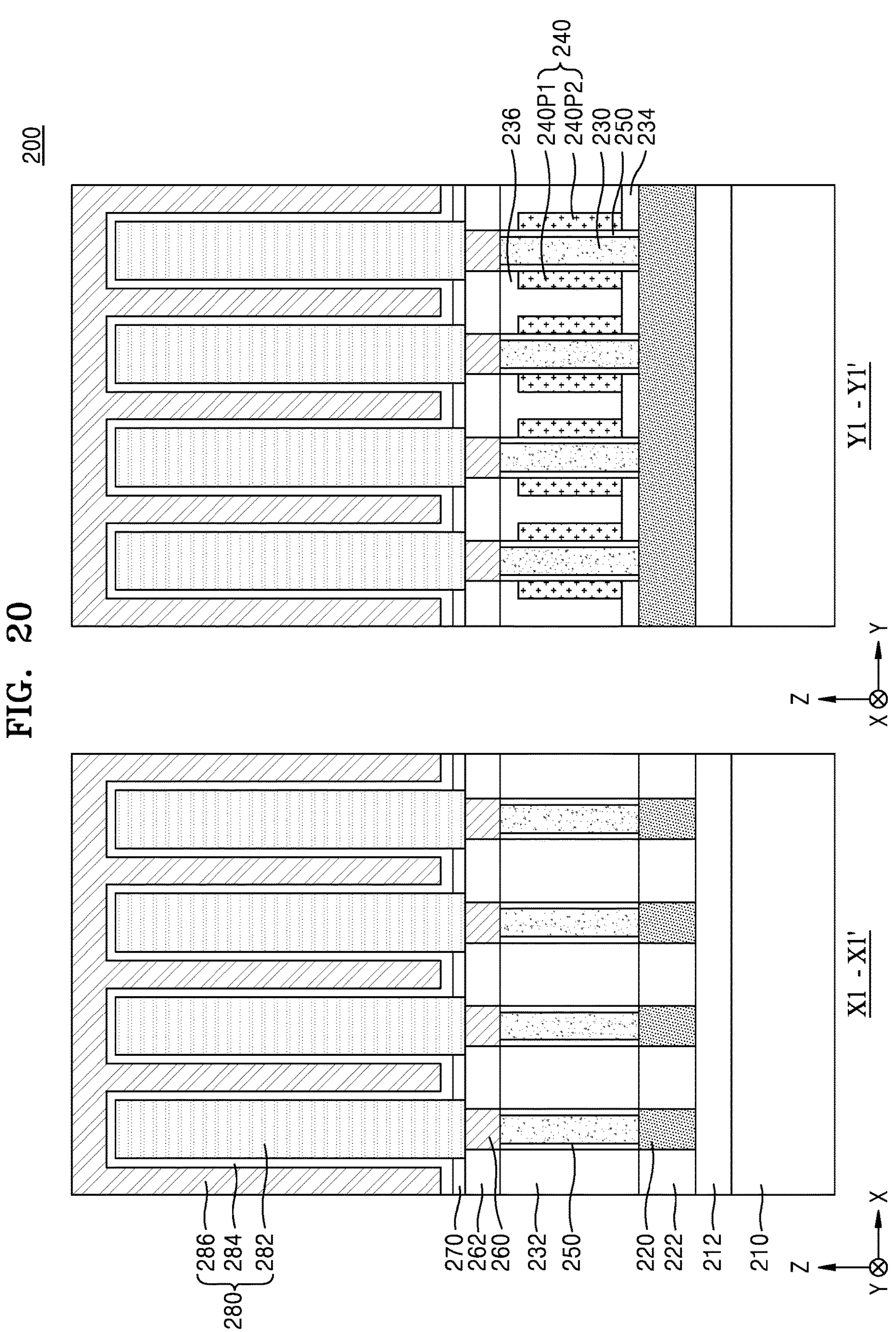
FIG. 20 includes cross-sectional views respectively taken along lines X1-X1' and Y1-Y1' of FIG. 18.

FIG. 18 is a layout diagram illustrating an integrated circuit device 200 according to embodiments, FIG. 19 is a perspective view of the integrated circuit device 200, and FIG. 20 illustrates cross-sectional views respectively taken along lines X1-X1' and Y1-Y1' of FIG. 18.

Referring to FIGS. 18 to 20, the integrated circuit device 200 may include a substrate 210, a plurality of first conductive lines 220, a channel layer 230, a gate electrode 240, a gate insulating layer 250, and a capacitor structure 280. The integrated circuit device 200 may be a memory device including a vertical channel transistor (VCT). The VCT may refer to a structure in which a channel length of the channel layer 230 extends from the substrate 210 in a vertical direction.

A lower insulating layer 212 may be arranged on the substrate 210, and on the lower insulating layer 212, the plurality of first conductive lines 220 may be spaced apart from each other in a first direction (e.g., X direction) and extend in a second direction (e.g., Y direction). A plurality of first insulating patterns 222 may be arranged on the lower insulating layer 212 to fill a space between neighboring bit lines of the plurality of first conductive lines 220. The plurality of first insulating patterns 222 may extend in the second direction (e.g., Y direction), and upper surfaces of the plurality of first insulating patterns 222 may be arranged at the same level as that of upper surfaces of the plurality of first conductive lines 220. The plurality of first conductive lines 220 may function as a bit line of the integrated circuit device 200.

In embodiments, the plurality of first conductive lines 220 may each include doped polysilicon, metal, conductive metal nitride, conductive metal silicide, conductive metal oxide, or a combination thereof. For example, the plurality of first conductive lines 220 may each include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but are not necessarily limited thereto. The plurality of first conductive lines 220 may each include a single layer or multilayer, each including the above materials. In embodiments, the plurality of first conductive lines 220 may each include a two-dimensional (2D) semiconductor material, for example, the 2D semiconductor material may include graphene, carbon nanotubes, or a combination thereof.

A plurality of channel layers 230 be arranged on the plurality of first conductive lines 220 in island shapes apart from each other in the first horizontal direction X and the second horizontal direction Y. The channel layer 230 may have a first width in the first horizontal direction X and a first height in a vertical direction Z, and the first height may be greater than the first width. For example, the first height may be about 2 times to about 10 times the first width, but is not necessarily limited thereto. A bottom portion of the channel layer 230 may function as a first source/drain area, an upper portion of the channel layer 230 may function as a second source/drain area, and a portion of the channel layer 230, which is between the first and second source/drain areas, may function as a channel area. The channel layer 230 may be formed by a patterning operation using a top capping layer M24 (see FIG. 23) and a lower mask layer M22 (see FIG. 23) as etch masks. For example, the channel layer 230 may have a relatively large aspect ratio, and for example, the patterning operation of the channel layer 230 may be precisely adjusted by a patterning operation using the top capping layer M24 and the lower mask layer M22 as etch masks.

In embodiments, the channel layer 230 may include an oxide semiconductor, for example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. The channel layer 230 may include a single layer or multilayer of the oxide semiconductor. In some embodiments, the channel layer 230 may have a bandgap energy greater than that of silicon. For example, the channel layer 230 may have a bandgap energy of about 1.5 eV to about 5.6 eV. For example, the channel layer 230 may have optimal channel performance when having a bandgap energy of about 2.0 eV to about 4.0 eV. For example, the channel layer 230 may be polycrystalline or amorphous, but is not necessarily limited thereto. In embodiments, the channel layer 230 may include a 2D semiconductor material, for example, the 2D semiconductor material may include graphene, carbon nanotubes, or a combination thereof.

The gate electrode 240 may extend on opposite sidewalls of the channel layer 230 in a first direction (e.g., X direction). The gate electrode 240 may include a first sub-gate electrode 240P1 facing a first sidewall of the channel layer 230, and a second sub-gate electrode 240P2 facing a second sidewall opposite to the first sidewall of the channel layer 230. As one channel layer 230 is between the first sub-gate electrode 240P1 and the second sub-gate electrode 240P2, the integrated circuit device 200 may have a dual-gate transistor structure. However, the inventive concept is not necessarily limited thereto, and a single gate transistor structure may also be implemented by omitting the second sub-gate electrode 240P2 and forming only the first sub-gate electrode 240P1 facing the first sidewall of the channel layer 230.

The gate electrode 240 may include doped polysilicon, metal, conductive metal nitride, conductive metal silicide, conductive metal oxide, or a combination thereof. For example, the gate electrode 240 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not necessarily limited thereto.

The gate insulating layer 250 may at least partially surround sidewalls of the channel layer 230 and may be between the channel layer 230 and the gate electrode 240. For example, as shown in FIG. 20, the entire sidewalls of the channel layer 230 may be at least partially surrounded by the gate insulating layer 250, and a portion of a sidewall of the gate electrode 240 may be in contact with the gate insulating layer 250. In embodiments, the gate insulating layer 250 may extend in an extension direction (first direction (e.g., X direction)) of the gate electrode 240, and among the sidewalls of the channel layer 230, only two sidewalls facing the gate electrode 240 may be in contact with the gate insulating layer 250.

In embodiments, the gate insulating layer 250 may include a silicon oxide film, a silicon nitride film, a high-k dielectric film having a higher dielectric constant than that of a silicon oxide film, or a combination thereof. The high-k dielectric film may include a metal oxide or a metal oxynitride. For example, a high-k dielectric film usable as the gate insulating layer 250 may include $HfO_2$, HfSiO, HfSiON, HMO, HfSiO, HfZrO, $ZrO_2$, $Al_2O_3$, or a combination thereof, but is not necessarily limited thereto.

A plurality of second insulating patterns 232 may extend on the plurality of first insulating patterns 222 in a second direction (e.g., Y direction), and the channel layer 230 may be arranged between two adjacent second insulating patterns 232 of the plurality of second insulating patterns 232. In addition, a first buried layer 234 and a second buried layer 236 may be arranged in a space between two adjacent channel layers 230 between two adjacent second insulating patterns 232. The first buried layer 234 may be arranged at a bottom portion of the space between two adjacent channel layers 230, and the second buried layer 236 may be formed on the first buried layer 234 to fill the remaining space between the two adjacent channel layers 230. An upper surface of the second buried layer 236 may be arranged on the same level as an upper surface of the channel layer 230, and the second buried layer 236 may cover the upper surface of the gate electrode 240. Alternatively, the plurality of second insulating patterns 232 may be include a continuous material layer with the plurality of first insulating patterns 222, and the second buried layer 236 may be include a continuous material layer with the first buried layer 234.

A capacitor contact 260 may be disposed on the channel layer 230. The capacitor contact 260 may vertically overlap the channel layer 230, and a plurality of capacitor contacts 260 may be arranged in a matrix form spaced apart from each other in the first direction (e.g., X direction) and the second direction (e.g., Y direction). The capacitor contact 260 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not necessarily limited thereto. An upper insulating layer 262 may at least partially surround sidewalls of the capacitor contact 260 on the plurality of second insulating patterns 232 and the second buried layer 236.

An etch stop layer 270 may be disposed on the upper insulating layer 262, and the capacitor structure 280 may be disposed on the etch stop layer 270. The capacitor structure 280 may include a lower electrode 282, a capacitor dielectric layer 284, and an upper electrode 286.

The lower electrode 282 may be electrically connected to an upper surface of the capacitor contact 260 by penetrating through the etch stop layer 270. The lower electrode 282 may be formed in a pillar type extending in a third direction (Z direction), but is not necessarily limited thereto. In embodiments, the lower electrode 282 may vertically overlap the capacitor contact 260, and a plurality of lower electrodes 282 may be arranged in a matrix form spaced apart from each other in the first direction (e.g., X direction) and the second direction (e.g., Y direction). Alternatively, a polysilicon layer may be further arranged between the capacitor contact 260 and the lower electrode 282, and the lower electrode 282 may also be arranged in a hexagonal shape.

Figure 21:
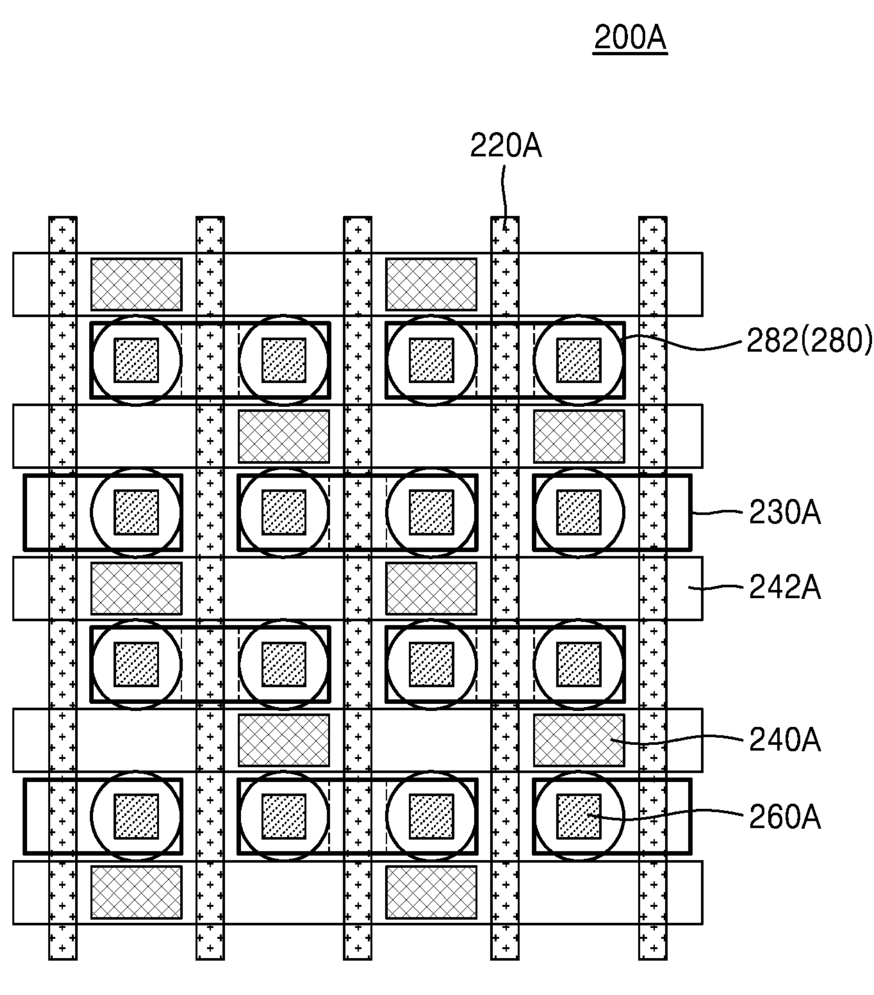
FIG. 21 is a layout diagram illustrating an integrated circuit device according to embodiments.
Figure 21:
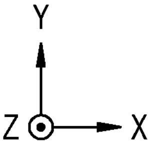
Figure 22:
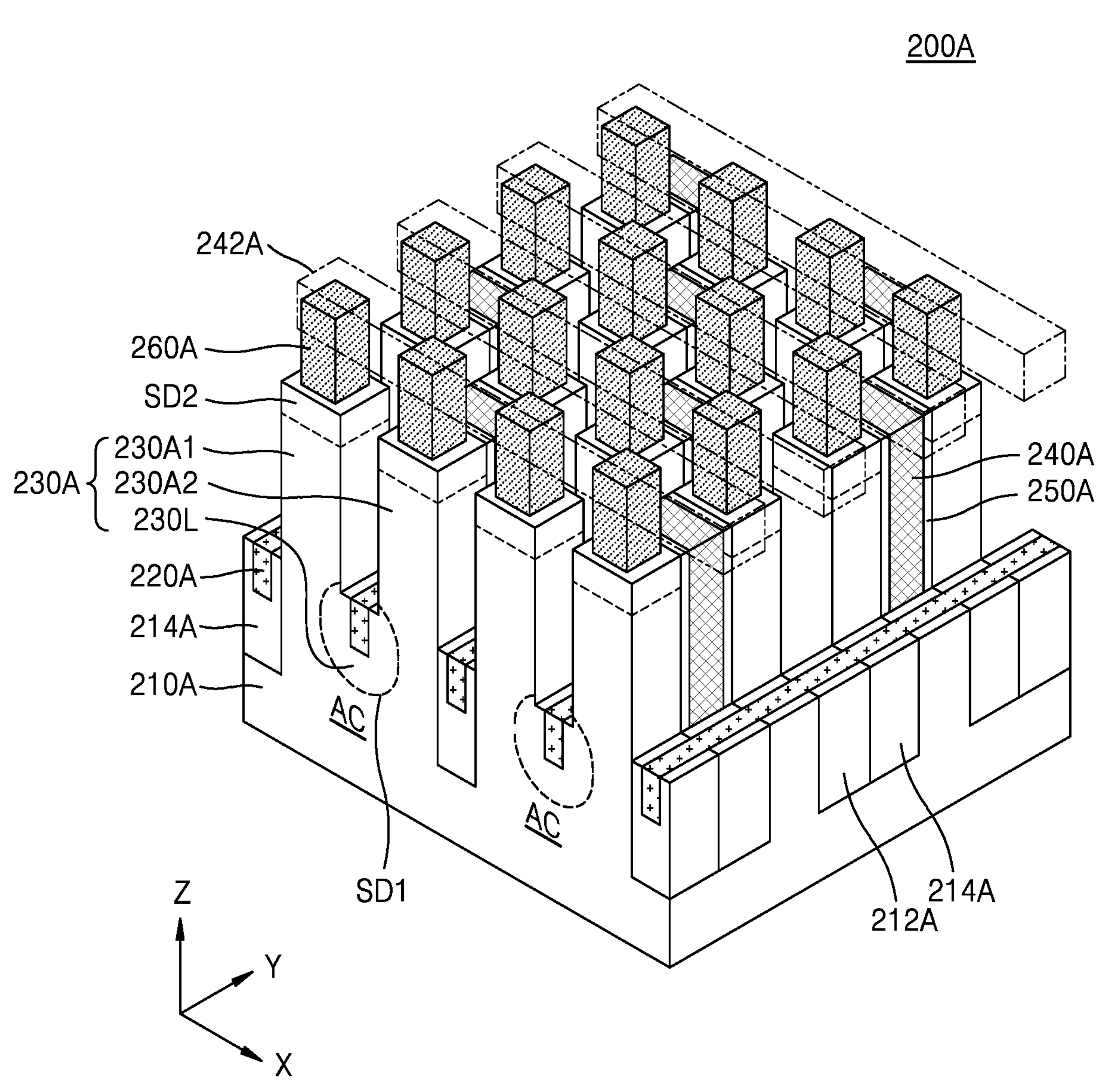
FIG. 22 is a perspective view illustrating the integrated circuit device of FIG. 21.

FIG. 21 is a layout diagram illustrating an integrated circuit device 200A according to embodiments, and FIG. 22 is a perspective view of the integrated circuit device 200A.

Referring to FIGS. 21 and 22, the integrated circuit device 200A may include a substrate 210A, a plurality of first conductive lines 220A, a channel structure 230A, a contact gate electrode 240A, a plurality of second conductive lines 242A, and a capacitor structure 280. The integrated circuit device 200A may be a memory device including a VCT.

A plurality of active areas AC may be defined in the substrate 210A by a first device isolation layer 212A and a second device isolation layer 214A. The channel structure 230A may be arranged in each of the plurality of active areas AC, and the channel structure 230A may include a first active pillar 230A1 and a second active pillar 230A2 each extending in a vertical direction, and a connection portion 230L connecting a bottom portion of the first active pillar 230A1 and a bottom portion of the second active pillar 230A2 to each other. A first source/drain area SD1 may be arranged in the connection portion 230L, and a second source/drain area SD2 may be arranged on each of the first active pillar 230A1 and the second active pillar 230A2. The first active pillar 230A1 and the second active pillar 230A2 may each configure an independent unit memory cell.

The channel structure 230A may be formed by a patterning operation using the top capping layer M24 (see FIG. 23) and the lower mask layer M22 (see FIG. 23) as an etch mask. For example, the channel structure 230A may have a relatively large aspect ratio, and for example, the patterning operation of the channel structure 230A may be precisely adjusted by a patterning operation using the top capping layer M24 and the lower mask layer M22 as etch masks.

The plurality of first conductive lines 220A may extend in a direction crossing each of the plurality of active areas AC, and may extend, for example, in the second direction (e.g., Y direction). One of the plurality of first conductive lines 220A may be arranged on the connection portion 230L between the first active pillar 230A1 and the second active pillar 230A2, and the one first conductive line 220A may be arranged on the first source/drain area SD1. The other first conductive line 220A adjacent to the one first conductive line 220A may be between two channel structures 230A. One of the plurality of first conductive lines 220A may function as a common bit line included in two unit memory cells respectively configured by the first active pillar 230A1 and the second active pillar 230A2, which are respectively arranged on both sides of the one first conductive line 220A.

One contact gate electrode 240A may be between two channel structures 230A, which are adjacent in the second direction (e.g., Y direction). For example, the contact gate electrode 240A may be between the first active pillar 230A1 of the channel structure 230A and the second active pillar 230A2 of the channel structure 230A, which is adjacent to the first active pillar 230A1, and the contact gate electrode 240A may be shared by the first active pillar 230A1 and the second active pillar 230A2, which are respectively on opposite sidewalls of the contact gate electrode 240A. A gate insulating layer 250A may be between the contact gate electrode 240A and the first active pillar 230A1 and between the contact gate electrode 240A and the second active pillar 230A2. The plurality of second conductive lines 242A may extend on an upper surface of the contact gate electrode 240A in the first direction (e.g., X direction). The plurality of second conductive lines 242A may function as a word line of the integrated circuit device 200A.

A capacitor contact 260A may be disposed on the channel structure 230A. The capacitor contact 260A may be disposed on the second source/drain area SD2, and the capacitor structure 280 may be disposed on the capacitor contact 260A.

Figure 23:
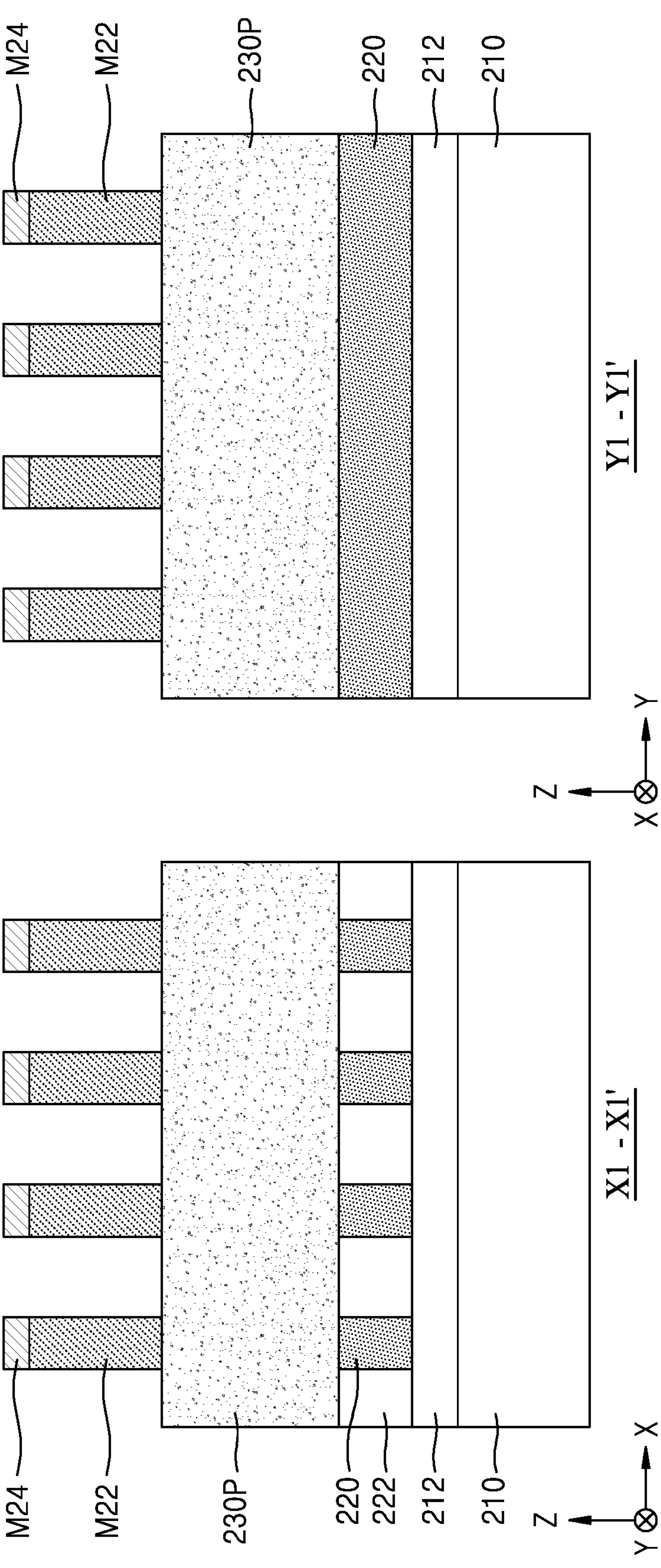
FIG. 23 is a cross-sectional view illustrating a method of manufacturing an integrated circuit device, according to embodiments.

FIG. 23 is a cross-sectional view illustrating a method of manufacturing the integrated circuit device 200, according to embodiments.

Referring to FIG. 23, the lower insulating layer 212 may be formed on the substrate 210, and the plurality of first conductive lines 220 and the plurality of first insulating patterns 222 filling spaces between neighboring bit lines of the plurality of first conductive lines 220 may be formed on the lower insulating layer 212.

A channel material layer 230P may be formed on the plurality of first insulating patterns 222 and the plurality of first conductive lines 220. The lower mask layer M22 and the top capping layer M24 may be formed on the channel material layer 230P. The lower mask layer M22 may be formed by using a first insulating material, for example, silicon nitride, and the top capping layer M24 may be formed by using a second insulating material that is different from the first insulating material, for example, titanium oxide. The lower mask layer M22 and the top capping layer M24 may be formed in an island shape in a plan view.

Thereafter, the channel layer 230 (see FIG. 20) may be formed by patterning the channel material layer 230P by using the top capping layer M24 and the lower mask layer M22. The channel layer 230 may have a first width in the first horizontal direction X and a first height in a vertical direction Z, and the first height may be greater than the first width. For example, the first height may be about 2 times to about 10 times the first width, but is not necessarily limited thereto. For example, the channel layer 230 may have a relatively large aspect ratio, and for example, the patterning operation of the channel layer 230 may be precisely adjusted by a patterning operation using the top capping layer M24 and the lower mask layer M22 as etch masks.

Referring to FIG. 20 again, the gate insulating layer 250 and the gate electrode 240 may be formed on sidewalls of the channel layer 230, and the first buried layer 234 and the second buried layer 236, which fill a space between the gate electrodes 240, may be formed. Thereafter, the capacitor contact 260 and the upper insulating layer 262 may be formed on the channel layer 230 and the first and second buried layers 234 and 236.

The integrated circuit device 200 may be completed according to the method described above.

While the inventive concept has been particularly shown and described with reference to embodiments thereof, it will be understood that various changes in form and details may be made therein without departing from the spirit and scope of the present disclosure.

What is claimed is:

1. A method of manufacturing an integrated circuit device, the method comprising:

forming multiple conductive layers on an upper surface of a substrate;

forming a capping structure disposed on the multiple conductive layers and extending in a first direction;

forming a plurality of bit lines, each extending in the first direction, by patterning the multiple conductive layers using the capping structure; and forming a plurality of buried layers in a space between neighboring bit lines of the plurality of bit lines, wherein the capping structure comprises a lower insulating capping layer disposed directly on an uppermost layer of the multiple conductive layers, an insulating layer disposed directly on the lower insulating capping layer, and a polysilicon layer disposed directly on the insulating layer, and wherein the polysilicon layer comprises a material having an etch selectivity with respect to the insulating layer.

2. The method of claim 1, wherein the forming of the capping structure comprises forming the polysilicon layer of the capping structure to cover an entire upper surface of the insulating layer of the capping structure.

3. The method of claim 1, further comprising:

etching the plurality of buried layers; and etching the polysilicon layer, wherein the polysilicon layer comprises a material having an etch selectivity with respect to the plurality of buried layers.

4. The method of claim 3, further comprising forming a plurality of insulating fences, wherein the plurality of insulating fences are formed in a space where the plurality of buried layers are etched.

5. The method of claim 4, wherein the polysilicon layer comprises a material having an etch selectivity with respect to the plurality of insulating fences.

6. The method of claim 4, wherein each of the plurality of insulating fences comprises a silicon nitride film, a silicon carbonitride film, or a combination thereof.

7. The method of claim 1, wherein each of the plurality of buried layers comprises silicon oxide.

8. The method of claim 1, wherein the lower insulating capping layer comprises a silicon nitride film, a silicon carbonitride film, or a combination thereof, and wherein the insulating layer comprises a silicon nitride film.

9. The method of claim 1, further comprising:

forming at least one peripheral circuit gate structure on the substrate; and forming a polysilicon layer on the at least one peripheral circuit gate structure, wherein the polysilicon layer comprises a material having an etch selectivity with respect to the at least one peripheral circuit gate structure.

10. The method of claim 9, wherein the forming of the polysilicon layer on the peripheral circuit gate structure comprises forming the polysilicon layer to cover an entire upper surface of the at least one peripheral circuit gate structure.

11. A method of manufacturing an integrated circuit device, the method comprising:

forming multiple conductive layers on an upper surface of a substrate;

forming a capping structure arranged on the multiple conductive layers and extending in a first direction;

forming a plurality of bit lines extending in the first direction by etching the multiple conductive layers using the capping structure, forming a spacer structure on opposite sidewalls of each of the plurality of bit lines; and forming a polysilicon layer in a space between neighboring bit lines of the plurality of bit lines, wherein the polysilicon layer covers an upper portion of each of the plurality of bit lines and is disposed directly on an outer surface of the spacer structure.

12. The method of claim 11, further comprising forming an insulating space by etching a portion of the polysilicon layer, wherein an insulating pattern is filled in the insulating space.

13. The method of claim 11, wherein each of the plurality of bit lines comprises a tungsten layer, and wherein an upper surface of the polysilicon layer is at a higher level than an upper surface of the tungsten layer.

14. The method of claim 11, wherein the polysilicon layer is arranged in the space between neighboring bit lines of the plurality of bit lines in a second direction perpendicular to the first direction.

15. The method of claim 11, wherein the polysilicon layer comprises a doping ion.

16. The method of claim 11, wherein at least a portion of the polysilicon layer is electrically connected to a capacitor lower electrode.

17. The method of claim 11, wherein at least a portion of the polysilicon layer is electrically connected to the substrate.

18. The method of claim 11, further comprising:

forming at least one peripheral circuit gate structure on the substrate; and forming a polysilicon layer on the at least one peripheral circuit gate structure, wherein the forming of the polysilicon layer on the at least one peripheral circuit gate structure comprises forming the polysilicon layer to cover an entire upper surface of the at least one peripheral circuit gate structure.

19. A method of manufacturing an integrated circuit device, the method comprising:

forming multiple conductive layers on an upper surface of a substrate;

forming a capping structure arranged on the multiple conductive layers and extending in a first direction;

forming a plurality of bit lines extending in the first direction by etching the multiple conductive layers using the capping structure;

forming a spacer structure on opposite sidewalls of each of the plurality of bit lines;

forming a polysilicon layer in a space between neighboring bit lines of the plurality of bit lines and directly on a surface of the spacer structure; and forming an insulating space by etching a portion of the polysilicon layer, wherein each of the plurality of bit lines comprises a tungsten layer, and an upper surface of the polysilicon layer is at a higher level than an upper surface of the tungsten layer, and wherein the polysilicon layer comprises doping ions and is arranged in a space between neighboring bit lines of the plurality of bit lines in a second direction perpendicular to the first direction, an upper end of the polysilicon layer is connected to a lower electrode of a capacitor formed on the plurality of bit lines, and a lower end of the polysilicon layer is connected to the substrate.

20. The method of claim 19, further comprising forming at least one peripheral circuit gate structure on the substrate; and forming a polysilicon layer on the at least one peripheral circuit gate structure, wherein the forming of the polysilicon layer on the at least one peripheral circuit gate structure comprises forming the polysilicon layer to cover an entire upper surface of the at least one peripheral circuit gate structure.

* * * * *